(12) United States Patent
Han et al.

(10) Patent No.: US 10,611,980 B2
(45) Date of Patent: *Apr. 7, 2020

(54) LUBRICANT CONTAINING HIGH-VISCOSITY METALLOCENE POLYALPHA-OLEFINS

(71) Applicant: ExxonMobil Chemical Patents Inc., Baytown, TX (US)

(72) Inventors: Wenning W. Han, Houston, TX (US); Marco A. Calzada, Katy, TX (US)

(73) Assignee: ExxonMobil Chemical Patents Inc., Baytown, TX (US)

( * ) Notice: Subject to any disclaimer, the term of this patent is extended or adjusted under 35 U.S.C. 154(b) by 174 days.

This patent is subject to a terminal disclaimer.

(21) Appl. No.: 15/847,458

(22) Filed: Dec. 19, 2017

(65) Prior Publication Data

US 2018/0142179 A1     May 24, 2018

Related U.S. Application Data

(63) Continuation-in-part of application No. 15/166,615, filed on May 27, 2016, now Pat. No. 10,059,898.
(Continued)

(51) Int. Cl.
    *C10M 107/10*      (2006.01)
    *C08F 4/6192*      (2006.01)
(Continued)

(52) U.S. Cl.
CPC ....... *C10M 107/10* (2013.01); *C08F 4/61922* (2013.01); *C08L 23/0815* (2013.01);
(Continued)

(58) Field of Classification Search
CPC ......... C10M 2203/024; C10N 2230/02; C10N 2240/04
(Continued)

(56) References Cited

U.S. PATENT DOCUMENTS 4,827,064 A * 5/1989 Wu ........................ C10G 50/02
                                                                                                                 585/10
6,846,778 B2      1/2005   Johnson et al.
(Continued)

FOREIGN PATENT DOCUMENTS

EP          1661921          5/2006
EP          1043341         10/2008
(Continued)

OTHER PUBLICATIONS

Han, "Our mPAO platform is expanding: Introducing SpectraSyn EliteTM 300," 2016 China International Lubricants, Base Oils and Additives Conference, Langham Palace, Sep. 19, 2016.
(Continued)

*Primary Examiner* — Vishal V Vasisth

(57) ABSTRACT

A lubricant composition comprising a high-viscosity PAO lubricant base stock having a KV100 of at least 200 cSt and comprising multiple PAO molecules comprising at least 200 carbon atoms per molecule, wherein (i) each of the PAO molecules comprises multiple pendant groups; (i) the average pendant group length of all the pendant groups excluding one methyl on each of the PAO molecules among at least 90 mol % of all the PAO molecules, if one or more methyl is present, is at least 6.0, and (iii) the concentration of the high-viscosity PAO base stock is no more than 75 wt % of the total weight of the lubricant composition. The lubricant composition exhibits provides a high degree of protection of gear surfaces as measured by ASTM D5182.

24 Claims, 15 Drawing Sheets

Related U.S. Application Data

(60) Provisional application No. 62/445,101, filed on Jan. 11, 2017, provisional application No. 62/241,843, filed on Oct. 15, 2015.

(51) Int. Cl.
   C08L 23/18        (2006.01)
   C08L 23/08        (2006.01)
   *G01R 33/46*          (2006.01)

(52) U.S. Cl.
   CPC .......... *C08L 23/18* (2013.01); *C08F 2500/15* (2013.01); *C08F 2500/16* (2013.01); *C08L 2207/10* (2013.01); *C10M 2205/0225* (2013.01); *C10N 2220/022* (2013.01); *C10N 2220/023* (2013.01); *C10N 2220/028* (2013.01); *C10N 2230/06* (2013.01); *C10N 2230/08* (2013.01); *C10N 2230/58* (2013.01); *C10N 2240/04* (2013.01); *C10N 2240/042* (2013.01); *C10N 2270/00* (2013.01); *G01R 33/46* (2013.01)

(58) Field of Classification Search
   USPC ........................................................ 508/200
   See application file for complete search history.

(56) References Cited

U.S. PATENT DOCUMENTS

| | | | |
|---|---|---|---|
| 6,858,767 | B1 | 2/2005 | Dimaio et al. |
| 7,019,091 | B2 | 3/2006 | Minami et al. |
| 7,053,254 | B2 | 5/2006 | Miller |
| 7,129,197 | B2 | 10/2006 | Song et al. |
| 7,241,375 | B2 | 7/2007 | Johnson et al. |
| 7,344,631 | B2 | 3/2008 | Bishop et al. |
| 7,589,145 | B2 | 9/2009 | Brant et al. |
| 7,795,194 | B2 | 9/2010 | Iimura et al. |
| 7,880,047 | B2 | 2/2011 | Knowles et al. |
| 8,071,687 | B2 | 12/2011 | Jiang et al. |
| 8,227,392 | B2 | 7/2012 | Wu et al. |
| 8,389,780 | B2 | 3/2013 | Knowles et al. |
| 8,530,712 | B2 | 9/2013 | Wu et al. |
| 8,748,361 | B2 | 6/2014 | Wu et al. |
| 8,816,034 | B2 | 8/2014 | Sato et al. |
| 9,409,834 | B2 | 8/2016 | Wu et al. |
| 2005/0049373 | A1 | 3/2005 | Minami et al. |
| 2008/0042037 | A1 | 2/2008 | Orr |
| 2008/0177121 | A1 | 7/2008 | Wu et al. |
| 2009/0005279 | A1 | 1/2009 | Wu et al. |
| 2009/0036725 | A1 | 2/2009 | Wu et al. |
| 2009/0088355 | A1 | 4/2009 | Hee et al. |
| 2009/0247442 | A1 | 10/2009 | Hagemeister et al. |
| 2010/0087349 | A1 | 4/2010 | Lee et al. |
| 2010/0317904 | A1 | 12/2010 | Small et al. |
| 2010/0323937 | A1 | 12/2010 | Wu et al. |
| 2011/0040052 | A1 | 2/2011 | BBurton et al. |
| 2011/0082061 | A1 | 4/2011 | Carey et al. |
| 2011/0092752 | A1 | 4/2011 | Knowles et al. |
| 2011/0160502 | A1 | 6/2011 | Wu et al. |
| 2012/0302481 | A1 | 11/2012 | Katayama et al. |
| 2013/0023633 | A1 | 1/2013 | Holtcamp et al. |
| 2013/0303818 | A1 | 11/2013 | Inagaki et al. |
| 2014/0087986 | A1 | 3/2014 | Patil et al. |
| 2014/0135461 | A1 | 5/2014 | Kohiruimaki et al. |
| 2014/0187457 | A1* | 7/2014 | Kanga .................. C10M 169/04 508/464 |
| 2014/0235909 | A1 | 8/2014 | Shimizu et al. |
| 2014/0256997 | A1 | 9/2014 | Shimizu et al. |
| 2014/0309151 | A1 | 10/2014 | Shimizu et al. |
| 2015/0099679 | A1 | 4/2015 | Yang et al. |
| 2017/0051223 | A1 | 2/2017 | Han |

FOREIGN PATENT DOCUMENTS

| | | |
|---|---|---|
| EP | 2738185 | 6/2014 |
| EP | 2746302 | 6/2014 |
| EP | 2470571 | 12/2014 |
| JP | 2005200450 | 7/2005 |
| JP | 5357605 | 4/2009 |
| JP | 4283120 | 6/2009 |
| JP | 2010/065072 | 3/2010 |
| JP | 2010/070593 | 4/2010 |
| JP | 5808292 | 6/2012 |
| JP | 2013199517 | 10/2013 |
| JP | 2013199585 | 10/2013 |
| WO | 2002/14384 A | 2/2002 |
| WO | 2005/121280 | 12/2005 |
| WO | 2007/011459 A | 1/2007 |
| WO | 2008/042037 | 4/2008 |
| WO | 2009/017953 | 2/2009 |
| WO | 2009/123800 | 10/2009 |
| WO | 2009/148685 | 12/2009 |
| WO | 2011/019541 A | 2/2011 |
| WO | 2013055483 | 4/2013 |
| WO | 2014/065984 | 5/2014 |
| WO | 2014/209712 | 12/2014 |
| WO | 2017/034659 | 3/2017 |

OTHER PUBLICATIONS

Ewen et al., "Stereoblock Isotactic-Hemiisotatctic Poly(propylene)s and Ethylene/Propylene Copolymers Obtained with ansa-Cyclopenta[1,2-b;4,3-b']dithiophene Catalysts", Macromolecular Chemistry and Physics (2004), 205, pp. 302-307.

Miller, S.A. "Insertion vs. site epimerization with singly-bridged and doubly-bridged metallocene polymerization catalysts", Journal of Organometallic Chemistry (2007), 692, pp. 4708-4716.

"Industrial Technology of Next Generation Polymer by Metallocene Catalyst," (Reference A) title page, p. 993, and publication data (published May 20, 1995), and alleged partial translation provided by third party law firm, Enclosure 2, dated Oct. 4, 2012, Hoffmann EITLE, Patent- und Rechtsanwalte, 81925 Munchen, Arabellastr. 4.

"Living Polymerization by Homogeneous Transition Metal Catalyst," (Reference B) title page, pp. 46 and 47 and page with publication data (published on May 20, 1999), and alleged partial translation provided by third party law firm, Enclosure 3, dated Oct. 4, 2012, Hoffmann.cndot.EITLE, Patent- und Rechtsanwalte, 81925 Mu{umlaut over (n)}chen, Arabellastr. 4.

E. Riedel, Editor, Walter de Gruvter, Berlin, NY, 1999, Modem Inorganic Chemistry, Title page and pp. 696-697, alleged English translation provided by third party law firm. Hoffman EITLE Patent-und Rechtsanwalte, 81925 Munchen, Arabellastr 4.Enclosure 1dated Oct. 4, 2012.

"New Polymer Produced by Metallocene Catalyst," (Reference C) title page, pp. 53-55 and page with publication data (published on Apr. 20, 1999), and alleged partial translation provided by third party law firm, Enclosure 4, dated Oct. 4, 2012, Hoffmann.cndot. EITLE, Patent- und Rechtsanwalte, 81925 Munchen, Arabellastr. 4.

M.M. Wu, Synthetic Lubricants and High Performance Functional Fluids, Marcel Dekker, book. Mar. 1999, pp. 195-213; Chapter 7. Alkylated Aromatics.

M. Sacchi et al., "Use of Different Alkoxysilanes as External Donors in MgClrSupported Ziegler-Hatta Catalysts to Obtain Propene/1-Butene Copolymers With Different Microstructure," Macromolecular Chemistry and Physics, 1994, vol. 195, pp. 2805-2816.

Z. Fan et al., "Effect of Ethoxy- and Methoxysilane Donors in Propene/1-Hexene Copolymerization With High-Yield Supported Ziegler-Hatta Catalysts," Macromolecular Chemistry and Physics, 1994, vol. 195, pp. 3889-3899.

Lappin, "Routes to Alpha-Olefins", Alpha Olefins Applications Handbook, Chapter 3, Edited by G. R. Lappin and J. D. Sauer, Marcel Dekker, Inc., 1989.

Rizvi, "Dispersants", Lubricant Additives: Chemistry and Application, Chapter 5, ed. By Leslie R. Rudnick, p. 143-170.

(56) References Cited

OTHER PUBLICATIONS

Sequeira, "Lubricant Base Oil Hydrogen Refining Processes" Lubricant Base Oil and Wax Processing, Chapter 6, by Avilino Sequeira, Jr., Marcel Dekker, Inc., NY, 1994, pp. 119-152.

* cited by examiner

LUBRICANT CONTAINING HIGH-VISCOSITY METALLOCENE POLYALPHA-OLEFINS

PRIORITY CLAIM

This application claims the benefit of Provisional Application No. 62/445,101, filed Jan. 11, 2017, the disclosure of which is incorporated herein by reference. This application is also a continuation-in-part application of U.S. patent application Ser. No. 15/166,615, now U.S. Pat. No. 10,059,898 having a filing date of May 27, 2016 and entitled "High-Viscosity Metallocene Polyalpha-Olefins with High Electrohydrodynamic Performance," which, in turn, claims priority to U.S. Provisional Patent Application Ser. No. 62/241,843 having a filing to date of Oct. 15, 2015 and entitled "High-Viscosity Metallocene Polyalpha-Olefins With High Electrohydrodynamic Performance," the contents of both of which are incorporated herein by reference in their entirety.

FIELD

The present invention relates to lubricant compositions comprising polyalpha-olefins (PAO) base stock. In particular, the present invention relates to lubricant compositions comprising a high-viscosity PAO base stock.

BACKGROUND

Lubricants in commercial use today are prepared from a variety of natural and synthetic base stocks admixed with various additive packages and solvents depending upon their intended application. The base stocks can include, e.g., Groups I, II and III mineral oils, gas-to-liquid base oils (GTL), Group IV polyalpha-olefins (PAO) including but not limited to PAOs made by using metallocene catalysts (mPAOs), Group V alkylated aromatics (AA) which include but are not limited to alkylated naphthalenes (ANs), silicone oils, phosphate esters, diesters, polyol esters, and the like.

Manufacturers and users of lubricating compositions desire to improve performance by extending oil drain life of the lubricating composition. Extended drain life is a highly desirable marketing feature of lubricating compositions, especially Group IV/Group V lubricating compositions.

Between machine elements, a thin film of lubricant wedges itself between the would-be contacting surfaces, thereby inhibiting metal-to-metal contact. In electrohydrodynamic lubrication (EHL) conditions, the contact pressures are so high that formation of such film wedge is extremely difficult.

Component in a formulation, typically with higher viscosity, that can provide good EHL film thickness is sought after for that will benefit the lubricant performance in EHL condition. However, the EHL film thickness of a family of molecular structure, typically, increases with increased molecular size, i.e. with increased viscosity at the given operating temperature. But in a given formulation classification, commonly with required final viscosity range, the amount of high viscosity material used must decrease with its viscosity increase following the blending rules. In addition, increase of the viscosity of the high viscosity component and/or increase the high viscosity component treat rate often means that the low temperature performance of the formulation must carry a debit. The formulators must find a balance considering these effects when evaluating a high viscosity component.

Moreover, it is desired that lubricant compositions provide sufficient protection of lubricated surfaces, particularly wear protection for gear box oils and automotive transmission oils.

SUMMARY

It has been found, in a surprising manner, that a lubricant composition comprising a high-viscosity PAO lubricant base stock, especially a mPAO base stock, having a KV100 of at least 200 and a high average pendant group length and a high EHL film thickness can provide superior wear protection of lubricated surfaces, even used at exceedingly low concentrations in the lubricant composition.

Thus, the present invention relates to lubricant composition comprising a high-viscosity PAO base stock having a KV100 of at least 200 cSt and comprising multiple PAO molecules comprising at least 200 carbon atoms per molecule, wherein each of substantially all of the PAO molecules comprises multiple pendant groups; the average pendant group length of all the pendant groups on each PAO molecule among at least 90 mol % of all of the PAO molecules is at least 6.0; and the concentration of the high-viscosity PAO base stock is no higher than 75 wt % of the total weight of the lubricant composition. The lubricant composition can be particularly advantageously an automotive gear oil or an automotive transmission oil providing high performance in terms of gear surface wear protection.

BRIEF DESCRIPTION OF THE DRAWINGS

FIGS. 11A and 11B are diagrams showing FZG test performance of a series of AGO lubricant formulations in terms of oil temperature at end of stage and gear weight loss at the end of stage, respectively.

DETAILED DESCRIPTION

Figure 1:
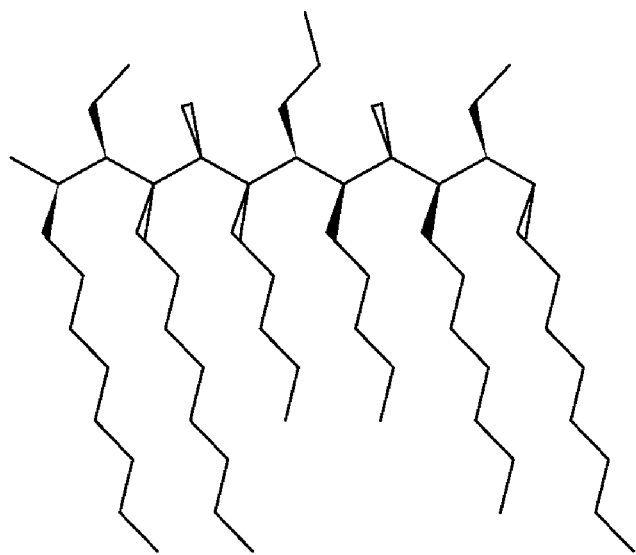
FIG. 1 is a molecular structure of a typical conventional PAO (cPAO) made from linear alpha olefins (LAO) monomers by using a Lewis acid as a catalyst.

As used herein, the term "olefin" refers to an unsaturated hydrocarbon compound having a hydrocarbon chain containing at least one carbon-to-carbon double bond in the structure thereof, wherein the carbon-to-carbon double bond does not constitute a part of an aromatic ring. The olefin may be straight-chain, branched-chain or cyclic. "Olefin" is intended to embrace all structural isomeric forms of olefins, unless it is specified to mean a single isomer or the context clearly indicates otherwise.

As used herein, the term "alpha-olefin" refer to an olefin having a terminal carbon-to-carbon double bond (($R^1R^2$)—C=$CH_2$) in the structure thereof.

As used herein, "polyalpha-olefin(s)" ("PAO(s)") includes any oligomer(s) and polymer(s) of one or more alpha-olefin monomer(s). PAOs are oligomeric or polymeric molecules produced from the polymerization reactions of alpha-olefin monomer molecules in the presence of a catalyst system, optionally further hydrogenated to remove residual carbon-carbon double bonds therein. Thus, the PAO can be a dimer, a trimer, a tetramer, or any other oligomer or polymer comprising two or more structure units derived from one or more alpha-olefin monomer(s). The PAO molecule can be highly regio-regular, such that the bulk material exhibits an isotacticity, or a syndiotacticity when measured by $^{13}C$ NMR. The PAO molecule can be highly regio-irregular, such that the bulk material is substantially atactic when measured by $^{13}C$ NMR. A PAO material made by using a metallocene-based catalyst system is typically called a metallocene-PAO ("mPAO"), and a PAO material made by using traditional non-metallocene-based catalysts (e.g., Lewis acids, supported chromium oxide, and the like) is typically called a conventional PAO ("cPAO").

As used herein, the term "carbon backbone" of a PAO molecule is defined as the straight carbon chain therein having the largest number of carbon atoms.

As used herein, the term "pendant group" with respect to a PAO molecule refers to any group other than hydrogen attached to the carbon backbone other than those attached to the carbon atoms at the very ends of the carbon backbone.

As used herein, the term "length" of a pendant group is defined as the total number of carbon atoms in the longest carbon chain in the pendant group, counting from the first carbon atom attached to the carbon backbone. The pendant group may contain a cyclic group or a portion thereof in the longest carbon chain, in which case half of the carbon atoms in the cyclic group are counted toward the length of the pendant group. Thus, by way of examples, a linear C8 pendant group has a length of 8; the pendant groups PG-1 (cyclohexylmethylene) and PG-2 (phenylmethylene) each has a length of 4; and the pendant groups PG-3 (o-heptylphenylmethylene) and PG-4 (p-heptylphenylmethylene) each has a length of 11. Where a PAO molecule contains multiple pendant groups, the arithmetic average of the lengths of all such pendant groups are calculated as the average length of the all pendant groups in the PAO molecule.

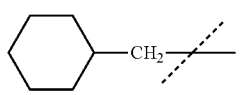

(PG-1)

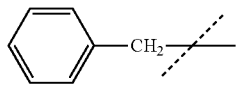

(PG-2)

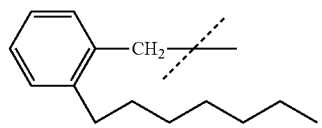

(PG-3)

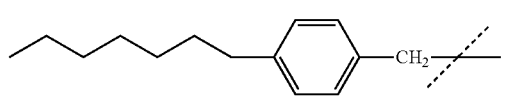

(PG-4)

Unless specified otherwise, the term "substantially all" with respect to PAO molecules means at least 90 mol % (such as at least 95 mol %, at least 98 mol %, at least 99 mol %, or even 100 mol %).

As used herein, the term "lubricant" refers to a substance that can be introduced between two or more moving surfaces and to lower the level of friction between two adjacent surfaces moving relative to each other. A lubricant "base stock" is a material, typically a fluid at the operating temperature of the lubricant, used to formulate a lubricant by admixing with other components. Non-limiting examples of base stocks suitable in lubricants include API Group I, Group II, Group III, Group IV, Group V and Group VI base stocks. PAOs, particularly hydrogenated PAOs, have recently found wide use in lubricant formulations as Group IV base stocks.

Carbon-13 NMR ($^{13}$C-NMR) is used to determine tacticity of the PAOs of the present invention. Carbon-13 NMR can be used to determine the concentration of the triads, denoted (m,m)-triads (i.e., meso, meso), (m,r)- (i.e., meso, racemic) and (r,r)- (i.e., racemic, racemic) triads, respectively. The concentrations of these triads defines whether the polymer is isotactic, atactic or syndiotactic. In the present disclosure, the concentration of the (m,m)-triads in mol % is recorded as the isotacticity of the PAO material. Spectra for a PAO sample are acquired in the following manner. Approximately 100-1000 mg of the PAO sample is dissolved in 2-3 ml of chloroform-d for $^{13}$C-NMR analysis. The samples are run with a 60 second delay and 90° pulse with at least 512 transients. The tacticity was calculated using the peak around 35 ppm ($CH_2$ peak next to the branch point). Analysis of the spectra is performed according to the paper by Kim, I.; Zhou, J.-M.; and Chung, H. Journal of Polymer Science: Part A: Polymer Chemistry 2000, 38 1687-1697. The calculation of tacticity is mm*100/(mm+mr+a) for the molar percentages of (m,m)-triads, mr*100/(mm+mr+a) for the molar percentages of (m,r)-triads, and rr*100/(mm+mr+a) for the molar percentages of (r,r)-triads. The (m,m)-triads correspond to 35.5-34.55 ppm, the (m,r)-triads to 34.55-34.1 ppm, and the (r,r)-triads to 34.1-33.2 ppm.

The viscosity-temperature relationship of a lubricant composition is one of the critical criteria which must be considered when selecting a lubricant for a particular application. Viscosity Index (VI) is an empirical, unitless number which indicates the rate of change in the viscosity of an oil within a given temperature range. Fluids exhibiting a relatively large change in viscosity with temperature are said to have a low viscosity index. A low VI oil, for example, will thin out at elevated temperatures faster than a high VI oil. Usually, the high VI oil is more desirable because it has higher viscosity at higher temperature, which translates into better or thicker lubrication film and better protection of the contacting machine elements. In another aspect, as the oil operating temperature decreases, the viscosity of a high VI oil will not increase as much as the viscosity of a low VI oil. This is advantageous because the excessive high viscosity of the low VI oil will decrease the efficiency of the operating machine. Thus high VI (HVI) oil has performance advantages in both high and low temperature operation. VI is determined according to ASTM method D 2270-93 [1998]. VI is related to kinematic viscosities measured at 40° C. and 100° C. using ASTM Method D 445-01.

The ASTM D5182 (referred to interchangeably as the "FZG test" herein) is a standard test for evaluating the scuffing load capacity of oils, which indicates fluid lubricating and wear protection properties at the interface of a loaded set of gears.

In the present disclosure, all percentages of pendant groups are by mole, unless specified otherwise.

In the present disclosure, all concentrations of base stocks in lubricant compositions are expressed by weight percentages of the total weight of the lubricant composition, unless specified otherwise.

The PAO Base Stock

A typical, hydrogenated PAO molecule can be represented by the following formula (F-1):

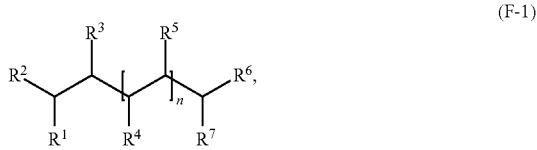

where $R^1$, $R^2$, $R^3$, each of $R^4$ and $R^5$, $R^6$, and $R^7$, the same or different at each occurrence, independently represents a hydrogen or a substituted or unsubstituted hydrocarbyl (preferably an alkyl) group, and n is an non-negative integer corresponding to the degree of polymerization.

Thus, where n=0, (F-1) represents a dimer produced from the reaction of two monomer molecules after a single addition reaction between two carbon-carbon double bonds.

Where n=m, m being a positive integer, (F-1) represents a molecule produced from the reactions of m+2 monomer molecules after m steps of addition reactions between two carbon-carbon double bonds.

Thus, where n=1, (F-1) represents a trimer produced from the reactions of three monomer molecules after two steps of addition reactions between two carbon-carbon double bonds.

Assuming a straight carbon chain starting from $R^1$ and ending with $R^7$ has the largest number of carbon atoms among all straight carbon chain existing in (F-1), that straight carbon chain starting from $R^1$ and ending with $R^7$ having the largest number of carbon atoms constitutes the carbon backbone of the PAO molecule (F-1). $R^2$, $R^3$, each of $R^4$ and $R^5$, and $R^6$, which can be substituted or unsubstituted hydrocarbyl (preferably alkyl) groups, are pendant groups (if not hydrogen).

If only alpha-olefin monomers are used in the polymerization process, and no isomerization of the monomers and oligomers ever occurs in the reaction system during polymerization, about half of $R^1$, $R^2$, $R^3$, all $R^4$ and $R^5$, $R^6$, and $R^7$ would be hydrogen, and one of $R^1$, $R^2$, $R^6$, and $R^7$ would be a methyl, and about half of groups $R^1$, $R^2$, $R^3$, all $R^4$ and $R^5$, $R^6$, and $R^7$ would be hydrocarbyl groups introduced from the alpha-olefin monomer molecules. In a specific example of such case, assuming $R^2$ is methyl, $R^3$, all $R^5$, and $R^6$ are hydrogen, and $R^1$, all $R^4$, and $R^7$ have 8 carbon atoms in the longest carbon chains contained therein, and n=8, then the carbon backbone of the (F-1) PAO molecule would comprise 35 carbon atoms, and the average pendant group length of the pendant groups ($R^2$, all of $R^4$) would be 7.22 (i.e., (1+8*8)/9). This PAO molecule, which can be produced by polymerizing 1-decene using certain metallocene catalyst systems described in greater detail below, can be represented by formula (F-2) below:

In this molecule, the longest 5%, 10%, 20%, 40%, 50%, and 100% of the pendant groups have average pendant group length of Lpg(5%) of 8, Lpg(10%) of 8, Lpg(20%) of 8, Lpg(50%) of 8, and Lpg(100%) of 7.22, respectively.

Depending on the polymerization catalyst system used, however, different degrees of isomerization of the monomers and/or oligomers can occur in the reaction system during the polymerization process, resulting in different degrees of substitution on the carbon backbone. In a specific example of such case, assuming $R^2$, $R^3$, all $R^5$ are methyls, and $R^6$ is hydrogen, $R^1$ has 8 carbon atoms in the longest straight carbon chain contained therein, and all $R^4$ and $R^7$ have 7 carbon atoms in the longest straight carbon chain contained therein, and n=8, then the carbon backbone of the (F-1) PAO molecule would comprise 34 carbon atoms, and the average pendant group length of the pendant groups ($R^2$, all $R^4$, and R5) would be 3.67 (i.e., (1+1+7*8+1*8)/18). This PAO molecule, which may be produced by polymerizing 1-decene using certain non-metallocene catalyst systems described in greater detail below, can be represented by the following formula (F-3):

In this molecule, the longest 5%, 10%, 20%, 40%, 50%, and 100% of the pendant groups have average pendant group lengths of Lpg(5%) of 7, Lpg(10%) of 7, Lpg(20%) of 7, Lpg(50%) of 6.3, and Lpg(100%) of 3.67, respectively.

PAO base stocks useful for the present invention may be a homopolymer made from a single alpha-olefin monomer or a copolymer made from a combination of two or more alpha-olefin monomers.

Preferable PAO base stocks useful for the present invention are produced from an alpha-olefin feed comprising one or more alpha-olefin monomers having an average number of carbon atoms in the longest straight carbon chain thereof in a range from Nc1 to Nc2, where Nc1 and Nc2 can be, e.g., 6.0, 6.5, 7.0, 7.5, 8.0, 8.5, 9.0, 9.5, 10.0, 10.5, 11.0, 11.5, 12.0, 12.5, 13.0, 13.5, 14.0, 14.5, 15.0, 15.5, or 16.0, as long as Nc1<Nc2. The "alpha-olefin feed" may be continuous or batch-wise. Each of the alpha-olefin monomer may comprise from 4 to 32 carbon atoms in the longest straight carbon chain therein. Preferably, at least one of the alpha-olefin monomer is a linear alpha-olefin (LAO). Preferably, the LAO monomers have even number of carbon atoms.

Non-limiting examples of the LAOs include but are not limited to 1-butene, 1-pentene, 1-hexene, 1-heptene, 1-octene, 1-nonene, 1-decene, 1-undecene, 1-dodecene, 1-tridecene, 1-tetradecene, 1-pentadecene, 1-hexadecene, 1-heptadecene, 1-octadecene, 1-nonadecene, 1-eicosene, 1-heneicosene, 1-docosene, 1-tricosene, 1-tetracosene in yet another embodiment. Preferred LAO feeds are 1-hexene, 1-octene, 1-decene, 1-dodecene, 1-tetradecene, 1-hexadecene and 1-octadecene. Preferably, the alpha-olefin feed comprises ethylene at a concentration not higher than 1.5 wt % based on the total weight of the alpha-olefin feed. Preferably, the alpha-olefin feed is essentially free of ethylene. Examples of preferred LAO mixtures as monomers for making the PAO useful in the present invention include, but are not limited to: C6/C8; C6/C10; C6/C12; C6/C14; C6/C16; C6/C8/C10; C6/C8/C12; C6/C8/C14; C6/C8/C16; C8/C10; C8/C12; C8/C14; C8/C16; C8/C10/C12; C8/C10/C14; C8/C10/C16; C10/C12; C10/C14; C10/C16; C10/C12/C14; C10/C12/C16; and the like.

During polymerization, the alpha-olefin monomer molecules react with components in or intermediates formed from the catalyst system and/or each other, resulting in the formation of covalent bonds between carbon atoms of the carbon-carbon double bonds of the monomer molecules, and eventually, an oligomer or polymer formed from multiple monomer molecules. The catalyst system may comprise a single compound or material, or multiple compounds or materials. The catalytic effect may be provided by a component in the catalyst system per se, or by an intermediary formed from reaction(s) between components in the catalyst system.

The catalyst system may be a conventional catalyst based on a Lewis acid such as $BF_3$ or $AlCl_3$, or a Friedel-Crafts catalyst. During polymerization, the carbon-carbon double bonds in some of the olefin molecules are activated by the catalytically active agent, which subsequently react with the carbon-carbon double bonds of other monomer molecules. It is known that the thus activated monomer and/or oligomers may isomerize, leading to a net effect of the shifting or migration of the carbon-carbon double bonds and the formation of multiple short-chain pendant groups, such as methyl, ethyl, propyl, and the like, on the carbon backbone of the final oligomer or polymer macromolecules. Therefore, the average pendant group length of PAOs made by using such conventional Lewis acid-based catalysts can be relatively low. In addition, the isomerization of the monomers and/or oligomers in the presence of Lewis acid can lead to the presence of pendant groups attached to adjacent carbon atoms on the carbon backbone. Furthermore, PAO oligomers and polymers made by using such conventional Lewis acid catalyst typically are atactic. FIG. 1 is an illustration of a conventional PAO (cPAO) molecule made from alpha olefins by using a Lewis acid catalyst. In this molecule, multiple methyl groups are present.

Alternatively or additionally, the catalyst system may comprise a non-metallocene Ziegler-Natta catalyst. Alternatively or additionally, the catalyst system may comprise a metal oxide supported on an inert material, e.g., chromium oxide supported on silica. Such catalyst system and use thereof in the process for making PAOs are disclosed in, e.g., U.S. Pat. No. 4,827,073 (Wu); U.S. Pat. No. 4,827,064 (Wu); U.S. Pat. No. 4,967,032 (Ho et al.); U.S. Pat. No. 4,926,004 (Pelrine et al.); and U.S. Pat. No. 4,914,254 (Pelrine), the relevant portions thereof are incorporated herein by reference in its entirety.

Figure 2:
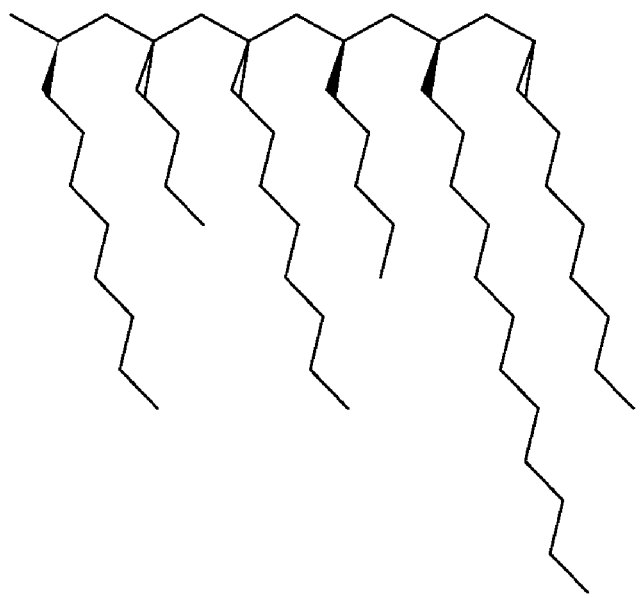
FIG. 2 is a molecular structure of a typical metallocene PAO (mPAO) made from long chain (C6 and longer) linear alpha olefins (LAO) monomers by using a metallocene catalyst system.
Figure 3:
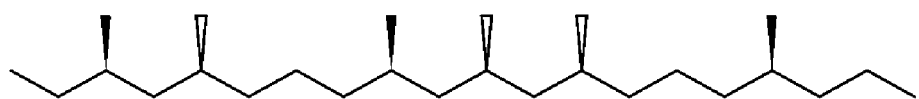
FIG. 3 is a molecular structure of a typical long backbone PAO made from ethylene and propylene by a metallocene catalyst system.

Preferably, the catalyst system comprises a metallocene compound and an activator and/or cocatalyst. Such metallocene catalyst system and method for making metallocene mPAOs using such catalyst systems are disclosed in, e.g., WO 2009/148685 A1, the content of which is incorporated herein by reference in its entirety. When metallocene catalyst systems are used, it is possible to make highly structurally regio-regular mPAO molecules. Specifically, one can make substantially isotactic or syndiotactic mPAO molecules in which pendant groups are essentially connected only to carbon atoms spaced apart by one intermediate carbon atom. Isotacticity is characterized by the presence of (mm)-triads, and syndiotacticity by the presence of (rm)-triads. FIG. 2 is an illustration of a mPAO molecule made from alpha olefins by using a metallocene catalyst, which exhibits a 100% isotactic structure, i.e., 100 mol % of (mm)-triads among all triads therein. In this molecule, there is only one methyl pendant group. Certain isotactic PAO molecules always comprise one and one only methyl pendant group, if alpha olefins having 4 or more carbon atoms on its longest carbon chain are exclusively used for the production thereof. Percentages of (mm)-triads, (rr)-triads and (mr)-triads in the molecules can be determined by using measurements such as NMR, particularly $C^{13}$-NMR.

Generally, when a supported chromium oxide or metallocene-containing catalyst system is used, isomerization of the olefin monomers and/or the oligomers occurs less frequently, if at all, than when a conventional Lewis acid-based catalyst such as $AlCl_3$ or $BF_3$ is used. Therefore, the average pendant group length of PAOs made by using these catalysts (i.e., mPAOs and chromium oxide PAOs, or chPAOs), can reach or approach the theoretical maximum, i.e., where no shifting of the carbon-carbon double bonds occurs during polymerization. Therefore, in the present invention, PAO base stocks made by using metallocene catalysts or supported chromium oxide catalysts (i.e., mPAOs and chPAOs) are preferred, assuming the same monomer(s) is used.

Thus, in the present invention, the PAO base stock comprises multiple oligomeric and/or polymeric PAO molecules, which may be the same or different. Each PAO molecule comprise multiple pendant groups, which may be the same or different, and the longest 5%, 10%, 20%, 40%, 50%, and 100% of the pendant groups of all of the molecules of the PAO base stock have an average pendant group length of Lpg(5%), Lpg(10%), Lpg(20%), Lpg(40%), Lpg(50%), and Lpg(100%), respectively. It is preferred that at least one of the following conditions is met:

(i) a1≤Lpg(10%)≤a2, where a1 and a2 can be, independently, 7.0, 7.5, 8.0, 8.5, 9.0, 9.5, 10.0, 10.5, 11.0, 11.5, or 12.0, as long as a1<a2;

(ii) b1≤Lpg(10%)≤b2, where b1 and b2 can be, independently, 7.0, 7.5, 8.0, 8.5, 9.0, 9.5, 10.0, 10.5, 11.0, 11.5, or 12.0, as long as b1<b2;

(iii) c1≤Lpg(20%)≤c2, where c1 and c2 can be, independently, 6.5, 7.0, 7.5, 8.0, 8.5, 9.0, 9.5, 10.0, 10.5, or 11.0, as long as c1<c2;

(iv) d1≤Lpg(40%)≤d2; where d1 and d2 can be, independently, 6.0, 6.5, 7.0, 7.5, 8.0, 8.5, 9.0, 9.5, 10.0, 10.5, or 11.0, as long as d1<d2;

(v) e1≤Lpg (50%)≤e2; where e1 and e2 can be, independently, 5.5, 6.0, 6.5, 7.0, 7.5, 8.0, 8.5, 9.0, 9.5, or 10.0, as long as e1<e2; and (vi) f1≤Lpg(100%)≤f2, where f1 and f2 can be, independently, 5.0, 5.5, 6.0, 6.5, 7.0, 7.5, 8.0, 8.5, 9.0, 9.5, or 10.0, as long as f1<f2.

The average pendant group length of all pendant groups on each molecule, excluding one methyl group, if there is one or more methyl pendant group, is Lpg(M). It is preferred that:

(vii) $g1 \leq L_{pg}(M) \leq g2$, where g1 and g2 can be, independently, 5.0, 5.5, 6.0, 6.5, 7.0, 7.5, 8.0, 8.5, 9.0, 9.5, or 10.0, as long as g1<g2.

Preferably, at least 60% of the pendant groups on the PAO molecules in the PAO base stock are straight chain alkyls having at least 6 carbon atoms. Preferably, at least 90% of the pendant groups on the PAO molecules in the PAO base stock are straight chain alkyls having at least 6 carbon atoms. Preferably, at least 60% of the pendant groups on the PAO molecules in the PAO base stock are straight chain alkyls having at least 8 carbon atoms. Preferably, at least 90% of the pendant groups on the PAO molecules in the PAO base stock are straight chain alkyls having at least 8 carbon atoms.

The PAO base stock useful in the present invention may have various levels of regio-regularity. For example, each PAO molecule may be substantially atactic, isotactic, or syndiotactic. The PAO base stock, however, can be a mixture of different molecules, each of which can be atactic, isotactic, or syndiotactic. Without intending to be bound by a particular theory, however, it is believed that regio-regular PAO molecules, especially the isotactic ones, due to the regular distribution of the pendant groups, especially the longer ones, tend to contribute to the highly desired EHL performance of the PAO base stock, and therefore preferred. Thus, it is preferred that at least 50%, or 60%, or 70%, or 80%, or 90%, or even 95%, by mole, of the PAO base stock molecules are regio-regular. It is further preferred that at least 50%, or 60%, or 70%, or 80%, or 90%, or even 95%, by mole, of the PAO base stock molecules are isotactic. PAO base stocks made by using metallocene catalysts can have such high regio-regularity (syndiotacticity or isotacticity), and therefore are preferred. For example, it is known that a metallocene-based catalyst system can be used to make PAO molecules with over 95%, or even substantially 100% isotacticity.

The PAO base stock useful for the present invention can have various viscosity. For example, it may have a KV100 in a range from 200 to 1000 cSt, such as 1 to 3000 cSt, 2 to 2000 cSt, 2 to 1000 cSt, 2 to 800 cSt, 2 to 600 cSt, 2 to 500 cSt, 2 to 400 cSt, 2 to 300 cSt, 2 to 200 cSt, or 5 to 100 cSt. The exact viscosity of the PAO base stock can be controlled by, e.g., monomer used, polymerization temperature, polymerization residence time, catalyst used, concentration of catalyst used, distillation and separation conditions, and mixing multiple PAO base stocks with different viscosity.

To achieve the desired level of kinematic viscosity of the base stock of the present invention, it is desired that at least 90 mol % of the PAO molecules comprise a total number of carbon atoms in the range from 300 to 800. Generally, the higher the total number of carbon atoms, the higher the average molecule average of the PAO molecules, and the higher the KV100 thereof.

For the present invention PAO base stock, it is highly desired that a majority of the pendant group on at least 90 mol % of the all of the PAO molecules are identical. This can be achieved by using one or more LAO feedstock with one of them constituting at least 50 mol % thereof, and using a metallocene catalyst. Without intending to be bound by a particular theory, it is believed such highly homogeneous pendant group length is beneficial for the overall EHL performance of the PAO base stock material.

Advantageously, the PAO base stock material of the present invention may have a polydispersity (PSD) in the range from 1.20 to 2.00. Generally, a narrow range of PSD can be achieved by using a metallocene catalyst, which can be beneficial to the shear stability, and many other important properties of the PAO base stock.

In general, it is desired that the PAO base stock used in the present invention has a bromine number in a range from Nb(PAO)1 to Nb(PAO)2, where Nb(PAO)1 and Nb(PAO)2 can be, independently, 0, 0.2, 0.4, 0.5, 0.6, 0.8, 1.0, 1.5, 2.0, 2.5, 3.0, 3.5, 4.0, 4.5, 5.0, as long as Nb(PAO)1<Nb(PAO)2. To reach such a low bromine number, it may be desired that the PAO used in the present invention has been subjected to a step of hydrogenation where the PAO has been in contact with a Hz-containing atmosphere in the presence of a hydrogenation catalyst, such as Co, Ni, Ru, Rh, Ir, Pt, and combinations thereof, such that at least a portion of the residual carbon-carbon double bonds present on the PAO molecules are saturated.

The Lubricant Composition

The lubricant composition of the presentation comprises the high-viscosity PAO base stock at a concentration no higher than 75 wt % based on the total weight of the lubricant composition. Thus, the concentration of the high-viscosity base stock in the composition can range from a1 wt % to a2 wt %, based on the total weight of the lubricant composition, wherein a1 and a2 can be, independently, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 3.0, 4.0, 5.0, 6.0, 7.0, 8.0, 9.0, 10, 12, 14, 15, 16, 18, 20, 22, 24, 25, 26, 28, 30, 35, 40, 45, 50, 55, 60, 65, 70, 75, as long as a1<a2.

Where the lubricant composition is used for a gear box oil not in an automatic transmission, the composition may comprise the high-viscosity PAO base stock at a concentration of at least 10 wt % and at most 50 wt %, within any of the range mentioned above. It has been found that even though the concentration of the high-viscosity base stock in the lubricant composition is set at a level lower than comparative high-viscosity base stocks, especially comparative hydrocarbon-based base stocks, the lubricant composition can nonetheless provide significantly superior performance in wear protection.

Where the lubricant composition is used in or as an automotive transmission oil, particularly an automatic transmission oil, the lubricant composition can desirably comprise, in addition to the high-viscosity PAO base stock, a low-viscosity base stock typically having a KV100 of at most 8 cSt, such that the transmission oil has a desirably low KV100, such as a KV100 lower than 10 cSt, or lower than 8 cSt, or even lower than 6 cSt, e.g., about 5 cSt. It is desired that the concentration of the low-viscosity base stock can be relatively high, e.g., in the range from b1 wt % to b2 wt %, based on the total weight of the lubricant composition, where b1 and b2 can be, independently, 70, 72, 74, 75, 76, 78, 80, 82, 84, 85, 86, 88, 90, 92, 94, 95, and 96, as long as b1<b2. The concentration of the high-viscosity base stock in the automotive transmission oil can range from, e.g., c1 wt % to c2 wt %, wherein c1 and c2 can be, independently, e.g., 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 3.0, 4.0, 5.0, 6.0, 7.0, 8.0, 9.0, 10, as long as c1<c2. It has been found that the automotive transmission oil thus formulated can provide excellent performance in wear protection.

The lubricant composition of the present invention may have a rotating pressure vessel oxidation test (RPVOT) break time, measured according to ASTM standard D-2272, of at least about 200 minutes, at least about 300 minutes, at least about 400 minutes, at least about 500 minutes, at least about 600 minutes, at least about 700 minutes, at least about 800 minutes, at least about 850 minutes, at least about 900 minutes or about 1000 minutes.

The lubricant composition of the present invention may have a kinematic viscosity at 100° C. (KV100), measured according to ASTM standard D-445, from about 1 to about 20 cSt, from about 1 to about 15 cSt, preferably from about 2 to about 10 cSt, preferably from about 2 to about 5.5 cSt, or more preferably from about 5 to about 5.5 cSt.

The lubricant composition of the present invention may have a kinematic viscosity at 40° C. (KV40), measured according to ASTM standard D-445, from about 10 to about 100 cSt, from about 10 to about 50 cSt, preferably from about 20 to about 40 cSt, and more preferably from about 20 to about 30 cSt.

The lubricant composition of the present invention may have a viscosity index (VI), measured according to ASTM standard D-2270, from about 25 to about 200, preferably from about 50 to about 200, and more preferably from about 70 to about 200.

The lubricant composition of the present invention may have a Noack volatility of no greater than about 25%, preferably no greater than about 20%, and more preferably no greater than about 18%. As used herein, Noack volatility is determined by ASTM D-5800.

The lubricant composition of the present invention may have a pour point measured according to ASTM standard D-5950, of lower than about 0.0° C., lower than about −10° C., lower than about −20° C., lower than about −30° C., lower than about −40° C., lower than about −45° C., lower than about −50° C., lower than about −55° C., lower than about −60° C. or −70° C. Preferably, the compositions provided herein may have a pour point of lower than about −55° C. The compositions provided herein may have a pour point of about −70° C. to about 0.0° C., about −70° C. to about −10° C., about −70° C. to about −20° C., about −70° C. to about −30° C., about −70° C. to about −40° C., about −70° C. to about −45° C., or about −70° C. to about −50° C.

The lubricant composition of the present invention may have a Brookfield viscosity at −40° C., measured according to ASTM standard D-2983, from about 10000 to about 30000 cP, preferably from about 15000 to about 25000 cP, and more preferably from about 17,500 to about 22,500 cP.

The lubricant composition of the present invention may comprise, in addition to the high-viscosity PAO base stock described above additional base and various additives described below.

Additional Lubricant Base Stocks

A wide range of lubricant base stocks is known in the art. Additional lubricating oils that are useful in the present disclosure include both natural oils and synthetic oils. Natural and synthetic oils (or mixtures thereof) can be used unrefined, refined, or re-refined (the latter is also known as reclaimed or reprocessed oil). Unrefined oils are those obtained directly from a natural or synthetic source and used without added purification. These include shale oil obtained directly from retorting operations, petroleum oil obtained directly from primary distillation, and ester oil obtained directly from an esterification process. Refined oils are similar to the oils discussed for unrefined oils except refined oils are subjected to one or more purification steps to improve the at least one lubricating oil property. One skilled in the art is familiar with many purification processes. These processes include solvent extraction, secondary distillation, acid extraction, base extraction, filtration, and percolation. Re-refined oils are obtained by processes analogous to refined oils but using an oil that has been previously used as a feed stock.

Groups I, II, III, IV and V are broad categories of base oil stocks developed and defined by the American Petroleum Institute (API Publication 1509; www.API.org) to create guidelines for lubricant base oils. Group I base stocks generally have a viscosity index of from 80 to 120 and contain greater than 0.03% sulfur and less than 90% saturates. Group II base stocks generally have a viscosity index of from 80 to 120, and contain less than or equal to 0.03% sulfur and greater than or equal to 90% saturates. Group III stock generally has a viscosity index greater than 120 and contains less than or equal to 0.03% sulfur and greater than 90% saturates. Group IV includes polyalpha-olefins (PAO). Group V base stocks include base stocks not included in Groups I-IV. TABLE III below summarizes properties of each of these five groups.

| Base Oil Properties | | | |
|---|---|---|---|
| | Saturates | Sulfur | Viscosity Index |
| Group I | <90 and/or | >0.03% and | ≥80 and <120 |
| Group II | ≥90 and | ≤0.03% and | ≥80 and <120 |
| Group III | ≥90 and | ≤0.03% and | ≥120 |
| Group IV | Includes PAO products | | |
| Group V | All other base oil stocks not included in Groups I, II, III or IV | | |

Natural oils include animal oils, vegetable oils (castor oil and lard oil, for example), and mineral oils. Animal and vegetable oils possessing favorable thermal oxidative stability can be used. Of the natural oils, mineral oils are preferred. Mineral oils vary widely as to their crude source, for example, as to whether they are paraffinic, naphthenic, or mixed paraffinic-naphthenic. Oils derived from coal or shale are also useful in the present disclosure. Natural oils vary also as to the method used for their production and purification, for example, their distillation range and whether they are straight run or cracked, hydrorefined, or solvent extracted.

Group II and/or Group III hydroprocessed or hydrocracked base stocks, as well as synthetic oils such as poly-alpha-olefins, alkyl aromatics and synthetic esters, i.e. Group IV and Group V oils are also well known base stock oils.

Synthetic oils include hydrocarbon oil such as polymerized and interpolymerized olefins (polybutyl ones, polypropylenes, propylene isobutylene copolymers, ethylene-olefin copolymers, and ethylene-alpha-olefin copolymers, for example). PAO oil base stocks, the Group IV API base stocks, are a commonly used synthetic hydrocarbon oil. By way of example, PAOs derived from $C_8$, $C_{10}$, $C_{12}$, $C_{14}$ olefins or mixtures thereof may be utilized. See U.S. Pat. Nos. 4,956,122; 4,827,064; and 4,827,073, which are incorporated herein by reference in their entirety. Group IV oils, that is, the PAO base stocks have viscosity indices preferably greater than 130, more preferably greater than 135, still more preferably greater than 140.

Esters in a minor amount may be useful in the lubricant compositions of this disclosure. Additive solvency and seal compatibility characteristics may be secured by the use of esters such as the esters of dibasic acids with monoalkanols and the polyol esters of monocarboxylic acids. Esters of the former type include, for example, the esters of dicarboxylic acids such as phthalic acid, succinic acid, sebacic acid, fumaric acid, adipic acid, linoleic acid dimer, malonic acid, alkyl malonic acid, alkenyl malonic acid, etc., with a variety of alcohols such as butyl alcohol, hexyl alcohol, dodecyl alcohol, 2-ethylhexyl alcohol, etc. Specific examples of these types of esters include dibutyl adipate, di(2-ethylhexyl) sebacate, di-n-hexyl fumarate, dioctyl sebacate, diisooctyl azelate, diisodecyl azelate, dioctyl phthalate, didecyl phthalate, dieicosyl sebacate, etc.

Particularly useful synthetic esters are those which are obtained by reacting one or more polyhydric alcohols, preferably the hindered polyols such as the neopentyl polyols; e.g., neopentyl glycol, trimethylol ethane, 2-methyl-2-propyl-1,3-propanediol, trimethylol propane, pentaerythritol and dipentaerythritol with alkanoic acids containing at least 4 carbon atoms, preferably $C_5$ to $C_{30}$ acids such as saturated straight chain fatty acids including caprylic acid, capric acids, lauric acid, myristic acid, palmitic acid, stearic acid, archaic acid, and behenic acid, or the corresponding branched chain fatty acids or unsaturated fatty acids such as oleic acid, or mixtures of any of these materials.

Esters should be used in an amount such that the improved wear and corrosion resistance provided by the lubricant compositions of this disclosure are not adversely affected.

Non-conventional or unconventional base stocks and/or base oils include one or a mixture of base stock(s) and/or base oil(s) derived from: (1) one or more Gas-to-Liquids (GTL) materials, as well as (2) hydrodewaxed, or hydroisomerized/cat (and/or solvent) dewaxed base stock(s) and/or base oils derived from synthetic wax, natural wax or waxy feeds, mineral and/or non-mineral oil waxy feed stocks such as gas oils, slack waxes (derived from the solvent dewaxing of natural oils, mineral oils or synthetic oils; e.g., Fischer-Tropsch feed stocks), natural waxes, and waxy stocks such as gas oils, waxy fuels hydrocracker bottoms, waxy raffinate, hydrocrackate, thermal crackates, foots oil or other mineral, mineral oil, or even non-petroleum oil derived waxy materials such as waxy materials recovered from coal liquefaction or shale oil, linear or branched hydrocarbyl compounds with carbon number of 20 or greater, preferably 30 or greater and mixtures of such base stocks and/or base oils.

GTL materials are materials that are derived via one or more synthesis, combination, transformation, rearrangement, and/or degradation/deconstructive processes from gaseous carbon-containing compounds, hydrogen-containing compounds and/or elements as feed stocks such as hydrogen, carbon dioxide, carbon monoxide, water, methane, ethane, ethylene, acetylene, propane, propylene, propyne, butane, butylenes, and butynes. GTL base stocks and/or base oils are GTL materials of lubricating viscosity that are generally derived from hydrocarbons; for example, waxy synthesized hydrocarbons, that are themselves derived from simpler gaseous carbon-containing compounds, hydrogen-containing compounds and/or elements as feed stocks. GTL base stock(s) and/or base oil(s) include oils boiling in the lube oil boiling range (1) separated/fractionated from synthesized GTL materials such as, for example, by distillation and subsequently subjected to a final wax processing step which involves either or both of a catalytic dewaxing process, or a solvent dewaxing process, to produce tube oils of reduced/low pour point; (2) synthesized wax isomerates, comprising, for example, hydrodewaxed or hydroisomerized cat and/or solvent dewaxed synthesized wax or waxy hydrocarbons; (3) hydrodewaxed or hydroisomerized cat and/or solvent dewaxed Fischer-Tropsch (F-T) material (i.e., hydrocarbons, waxy hydrocarbons, waxes and possible analogous oxygenates); preferably hydrodewaxed or hydroisomerized/followed by cat and/or solvent dewaxing dewaxed F-T waxy hydrocarbons, or hydrodewaxed or hydroisomerized/followed by cat (or solvent) dewaxing dewaxed, F-T waxes, or mixtures thereof.

GTL base stock(s) and/or base oil(s) derived from GTL materials, especially, hydrodewaxed or hydroisomerized/followed by cat and/or solvent dewaxed wax or waxy feed, preferably F-T material derived base stock(s) and/or base oil(s), are characterized typically as having kinematic viscosities at 100° C. of from 2 $mm^2/s$ to 50 $mm^2/s$ (ASTM D445). They are further characterized typically as having pour points of −5° C. to −40° C. or lower (ASTM D97). They are also characterized typically as having viscosity indices of 80 to 140 or greater (ASTM D2270).

In addition, the GTL base stock(s) and/or base oils) are typically highly paraffinic (>90% saturates), and may contain mixtures of monocycloparaffins and multicycloparaffins in combination with non-cyclic isoparaffins. The ratio of the naphthenic (i.e., cycloparaffin) content in such combinations varies with the catalyst and temperature used. Further, GTL base stock(s) and/or base oil(s) typically have very low sulfur and nitrogen content, generally containing less than 10 ppm, and more typically less than 5 ppm of each of these elements. The sulfur and nitrogen content of GTL base stock(s) and/or base oil(s) obtained from F-T material, especially F-T wax, is essentially nil. In addition, the absence of phosphorous and aromatics make this materially especially suitable for the formulation of low SAP products.

The term GTL base stock and/or base oil and/or wax isomerate base stock and/or base oil is to be understood as embracing individual fractions of such materials of wide viscosity range as recovered in the production process, mixtures of two or more of such fractions, as well as mixtures of one or two or more low viscosity fractions with one, two or more higher viscosity fractions to produce a blend wherein the blend exhibits a target kinematic viscosity.

The GTL material, from which the GTL base stock(s) and/or base oil(s) is/are derived is preferably an F-T material (i.e., hydrocarbons, waxy hydrocarbons, wax).

Base oils for use in the formulated lubricant compositions useful in the present disclosure are any of the variety of oils corresponding to API Group I, Group II, Group III, Group IV, Group V and Group VI oils and mixtures thereof, preferably API Group II, Group III, Group IV, Group V and Group VI oils and mixtures thereof, more preferably the Group III to Group VI base oils due to their exceptional volatility, stability, viscometric and cleanliness features. Minor quantities of Group I stock, such as the amount used to dilute additives for blending into formulated lube oil products, can be tolerated but should be kept to a minimum, i.e. amounts only associated with their use as diluent/carrier oil for additives used on an "as received" basis. Even in regard to the Group II stocks, it is preferred that the Group II stock be in the higher quality range associated with that stock, i.e. a Group II stock having a viscosity index in the range 100<VI<120.

In addition, the GTL base stock(s) and/or base oil(s) are typically highly paraffinic (>90% saturates), and may contain mixtures of monocycloparaffins and multicycloparaffins in combination with non-cyclic isoparaffins. The ratio of the naphthenic (i.e., cycloparaffin) content in such combinations varies with the catalyst and temperature used. Further, GTL base stock(s) and/or base oil(s) and hydrodewaxed, or hydroisomerized/cat (and/or solvent) dewaxed base stock(s) and/or base oil(s) typically have very low sulfur and nitrogen content, generally containing less than 10 ppm, and more typically less than 5 ppm of each of these elements. The sulfur and nitrogen content of GTL, base stock(s) and/or base oil(s) obtained from F-T material, especially F-T wax, is essentially nil. In addition, the absence of phosphorous and aromatics make this material especially suitable for the formulation of low sulfur, sulfated ash, and phosphorus (low SAP) products.

The lubricant compositions are based on high quality base stocks including a major portion comprising one or more compounds corresponding in structure to formula (F-1) as described herein. Alternatively, base stocks including a major portion of other components, such as a Group I, II and/or III mineral oil base stocks, GTL, Group IV (e.g., PAO), Group V (e.g., esters, alkylated aromatics, PAG), and minor portion comprising one or more compounds corresponding in structure to formula (F-1) as described herein as a co-base stock are also provided herein.

Additives

The formulated lubricating oil useful in the present disclosure may additionally contain one or more of the other commonly used lubricant composition performance additives including but not limited to dispersants, other detergents, corrosion inhibitors, rust inhibitors, metal deactivators, other anti-wear agents and/or extreme pressure additives, anti-seizure agents, wax modifiers, viscosity index improvers, viscosity modifiers, fluid-loss additives, seal compatibility agents, other friction modifiers, lubricity agents, anti-staining agents, chromophoric agents, defoamants, demulsifiers, emulsifiers, densifiers, wetting agents, gelling agents, tackiness agents, colorants, and others. For a review of many commonly used additives, see Klamann in Lubricants and Related Products, Verlag Chemie, Deerfield Beach, Fla.; ISBN 0-89573-177-0. Reference is also made to "Lubricant Additives Chemistry and Applications" edited by Leslie R. Rudnick, Marcel Dekker, Inc. New York, 2003 ISBN: 0-8247-0857-1.

The types and quantities of performance additives used in combination with the instant disclosure in lubricant compositions are not limited by the examples shown herein as illustrations.

Viscosity Improvers

Viscosity improvers (also known as Viscosity Index modifiers, and VI improvers) increase the viscosity of the oil composition at elevated temperatures which increases film thickness, while having limited effect on viscosity at low temperatures.

Suitable viscosity improvers include high molecular weight hydrocarbons, polyesters and viscosity index improver dispersants that function as both a viscosity index improver and a dispersant. Typical molecular weights of these polymers are from 10,000 to 1,000,000, more typically 20,000 to 500,000, and even more typically between 50,000 and 200,000.

Examples of suitable viscosity improvers are polymers and copolymers of methacrylate, butadiene, olefins, or alkylated styrenes. Polyisobutylene is a commonly used viscosity index improver. Another suitable viscosity index improver is polymethacrylate (copolymers of various chain length alkyl methacrylates, for example), some formulations of which also serve as pour point depressants. Other suitable viscosity index improvers include copolymers of ethylene and propylene, hydrogenated block copolymers of styrene and isoprene, and polyacrylates (copolymers of various chain length acrylates, for example). Specific examples include styrene-isoprene or styrene-butadiene based polymers of 50,000 to 200,000 molecular weight.

The amount of viscosity modifier may range from zero to 8 wt %, preferably zero to 4 wt %, more preferably zero to 2 wt % based on active ingredient and depending on the specific viscosity modifier used.

Antioxidants

Typical antioxidant include phenolic antioxidants, aminic antioxidants and oil-soluble copper complexes. Detailed description of such antioxidants and their quantities of use can be found, e.g., in WO 2015/060984 A1, the relevant portions thereof are incorporated herein by reference in their entirety.

Detergents

In addition to the alkali or alkaline earth metal salicylate detergent which is an essential component in the present disclosure, other detergents may also be present. While such other detergents can be present, it is preferred that the amount employed be such as to not interfere with the synergistic effect attributable to the presence of the salicylate. Therefore, most preferably such other detergents are not employed.

If such additional detergents are present, they can include alkali and alkaline earth metal phenates, sulfonates, carboxylates, phosphonates and mixtures thereof. These supplemental detergents can have total base number (TBN) ranging from neutral to highly overbased, i.e. TBN of 0 to over 500, preferably 2 to 400, more preferably 5 to 300, and they can be present either individually or in combination with each other in an amount in the range of from 0 to 10 wt %, preferably 0.5 to 5 wt % (active ingredient) based on the total weight of the formulated lubricant composition. As previously stated, however, it is preferred that such other detergent not be present in the formulation.

Such additional other detergents include by way of example and not limitation calcium phenates, calcium sulfonates, magnesium phenates, magnesium sulfonates and other related components (including borated detergents).

Dispersants

During engine operation, oil-insoluble oxidation byproducts are produced. Dispersants help keep these byproducts in solution, thus diminishing their deposition on metal surfaces. Dispersants may be ashless or ash-forming in nature. Preferably, the dispersant is ashless. So called ashless dispersants are organic materials that form substantially no ash upon combustion. For example, non-metal-containing or borated metal-free dispersants are considered ashless. In contrast, metal-containing detergents discussed above form ash upon combustion.

Suitable dispersants typically contain a polar group attached to a relatively high molecular weight hydrocarbon chain. The polar group typically contains at least one element of nitrogen, oxygen, or phosphorus. Typical hydrocarbon chains contain 50 to 400 carbon atoms.

A particularly useful class of dispersants are the alkenyl-succinic derivatives, typically produced by the reaction of a long chain substituted alkenyl succinic compound, usually a substituted succinic anhydride, with a polyhydroxy or polyamino compound. The long chain group constituting the oleophilic portion of the molecule which confers solubility in the oil, is normally a polyisobutylene group. Many examples of this type of dispersant are well known commercially and in the literature. Exemplary patents describing such dispersants are U.S. Pat. Nos. 3,172,892; 3,219,666; 3,316,177 and 4,234,435. Other types of dispersants are described in U.S. Pat. Nos. 3,036,003; and 5,705,458.

Hydrocarbyl-substituted succinic acid compounds are popular dispersants. In particular, succinimide, succinate esters, or succinate ester amides prepared by the reaction of a hydrocarbon-substituted succinic acid compound preferably having at least 50 carbon atoms in the hydrocarbon substituent, with at least one equivalent of an alkylene amine are particularly useful.

Succinimides are formed by the condensation reaction between alkenyl succinic anhydrides and amines. Molar ratios can vary depending on the amine or polyamine. For example, the molar ratio of alkenyl succinic anhydride to TEPA can vary from 1:1 to 5:1.

Succinate esters are formed by the condensation reaction between alkenyl succinic anhydrides and alcohols or polyols. Molar ratios can vary depending on the alcohol or polyol used. For example, the condensation product of an alkenyl succinic anhydride and pentaerythritol is a useful dispersant.

Succinate ester amides are formed by condensation reaction between alkenyl succinic anhydrides and alkanol amines. For example, suitable alkanol amines include ethoxylated polyalkylpolyamines, propoxylated polyalkylpolyamines and polyalkenylpolyamines such as polyethylene polyamines. One example is propoxylated hexamethylenediamine.

The molecular weight of the alkenyl succinic anhydrides will typically range between 800 and 2,500. The above products can be post-reacted with various reagents such as sulfur, oxygen, formaldehyde, carboxylic acids such as oleic acid, and boron compounds such as borate esters or highly borated dispersants. The dispersants can be borated with from 0.1 to 5 moles of boron per mole of dispersant reaction product.

Mannich base dispersants are made from the reaction of alkylphenols, formaldehyde, and amines. Process aids and catalysts, such as oleic acid and sulfonic acids, can also be part of the reaction mixture. Molecular weights of the alkylphenols range from 800 to 2,500.

Typical high molecular weight aliphatic acid modified Mannich condensation products can be prepared from high molecular weight alkyl-substituted hydroxyaromatics or $HN(R)_2$ group-containing reactants.

Examples of high molecular weight alkyl-substituted hydroxyaromatic compounds are polypropylphenol, polybutylphenol, and other polyalkylphenols. These polyalkylphenols can be obtained by the alkylation, in the presence of an alkylating catalyst, such as $BF_3$, of phenol with high molecular weight polypropylene, polybutylene, and other polyalkylene compounds to give alkyl substituents on the benzene ring of phenol having an average 600-100,000 molecular weight.

Examples of $HN(R)_2$ group-containing reactants are alkylene polyamines, principally polyethylene polyamines. Other representative organic compounds containing at least one $HN(R)_2$ group suitable for use in the preparation of Mannich condensation products are well known and include the mono- and di-amino alkanes and their substituted analogs, e.g., ethylamine and diethanol amine; aromatic diamines, e.g., phenylene diamine, diamino naphthalenes; heterocyclic amines, e.g., morpholine, pyrrole, pyrrolidine, imidazole, imidazolidine, and piperidine; melamine and their substituted analogs.

Examples of alkylene polyamine reactants include ethylenediamine, diethylene triamine, triethylene tetraamine, tetraethylene pentaamine, pentaethylene hexamine, hexaethylene heptaamine, heptaethylene octaamine, octaethylene nonaamine, nonaethylene decamine, and decaethylene undecamine and mixture of such amines having nitrogen contents corresponding to the alkylene polyamines, in the formula $H_2N$—$(Z$—$NH$—$)_nH$, mentioned before, Z is a divalent ethylene and n is 1 to 10 of the foregoing formula. Corresponding propylene polyamines such as propylene diamine and di-, tri-, tetra-, pentapropylene tri-, tetra-, penta- and hexaamines are also suitable reactants. The alkylene polyamines are usually obtained by the reaction of ammonia and dihalo alkanes, such as dichloro alkanes. Thus the alkylene polyamines obtained from the reaction of 2 to 11 moles of ammonia with 1 to 10 moles of dichloroalkanes having 2 to 6 carbon atoms and the chlorines on different carbons are suitable alkylene polyamine reactants.

Aldehyde reactants useful in the preparation of the high molecular products useful in this disclosure include the aliphatic aldehydes such as formaldehyde (also as paraformaldehyde and formalin), acetaldehyde and aldol (β-hydroxybutyraldehyde). Formaldehyde or a formaldehyde-yielding reactant is preferred.

Preferred dispersants include borated and non-borated succinimides, including those derivatives from mono-succinimides, leis-succinimides, and/or mixtures of mono- and bis-succinimides, wherein the hydrocarbyl succinimide is derived from a hydrocarbylene group such as polyisobutylene having a Mn of from 500 to 5000 or a mixture of such hydrocarbylene groups. Other preferred dispersants include succinic acid-esters and amides, alkylphenol-polyamine-coupled Mannich adducts, their capped derivatives, and other related components. Such additives may be used in an amount of 0.1 to 20 wt %, preferably 0.1 to 8 wt %, more preferably 1 to 6 wt % (on an as-received basis) based on the weight of the total lubricant.

Pour Point Depressants

Conventional pour point depressants (also known as lube oil flow improvers) may also be present. Pour point depressant may be added to lower the minimum temperature at which the fluid will flow or can be poured. Examples of suitable pour point depressants include alkylated naphthalenes polymethacrylates, polyacrylates, polyarylamides, condensation products of haloparaffin waxes and aromatic compounds, vinyl carboxylate polymers, and terpolymers of dialkylfumarates, vinyl esters of fatty acids and allyl vinyl ethers. Such additives may be used in amount of 0.0 to 0.5 wt %, preferably 0 to 0.3 wt %, more preferably 0.001 to 0.1 wt % on an as-received basis.

Corrosion Inhibitors/Metal Deactivators

Corrosion inhibitors are used to reduce the degradation of metallic parts that are in contact with the lubricant composition. Suitable corrosion inhibitors include aryl thiazines, alkyl substituted dimercapto thiodiazoles thiadiazoles and mixtures thereof. Such additives may be used in an amount of 0.01 to 0.5 wt %, preferably 0.01 to 1.5 wt %, more preferably 0.01 to 0.2 wt %, still more preferably 0.01 to 0.1 wt % (on an as-received basis) based on the total weight of the lubricant composition.

Seal Compatibility Additives

Seal compatibility agents help to swell elastomeric seals by causing a chemical reaction in the fluid or physical change in the elastomer. Suitable seal compatibility agents for lubricant compositions include organic phosphates, aromatic esters, aromatic hydrocarbons, esters (butylbenzyl phthalate, for example), and polybutenyl succinic anhydride and sulfolane-type seal swell agents such as Lubrizol 730-type seal swell additives. Such additives may be used in an amount of 0.01 to 3 wt %, preferably 0.01 to 2 wt % on an as-received basis.

Anti-Foam Agents

Anti-foam agents may advantageously be added to lubricant compositions. These agents retard the formation of stable foams. Silicones and organic polymers are typical anti-foam agents. For example, polysiloxanes, such as silicon oil or polydimethyl siloxane, provide antifoam properties. Anti-foam agents are commercially available and may be used in conventional minor amounts along with other additives such as demulsifiers; usually the amount of these additives combined is less than 1 percent, preferably 0.001 to 0.5 wt %, more preferably 0.001 to 0.2 wt %, still more preferably 0.0001 to 0.15 wt % (on an as-received basis) based on the total weight of the lubricant composition.

Corrosion Inhibitors and Antirust Additives

Antirust additives (or corrosion inhibitors) are additives that protect lubricated metal surfaces against chemical attack by water or other contaminants. One type of antirust additive is a polar compound that wets the metal surface preferentially, protecting it with a film of oil. Another type of antirust additive absorbs water by incorporating it in a water-in-oil emulsion so that only the oil touches the surface. Yet another type of antirust additive chemically adheres to the metal to produce a non-reactive surface. Examples of suitable additives include zinc dithiophosphates, metal phenolates, basic metal sulfonates, fatty acids and amines. Such additives may be used in an amount of 0.01 to 5 wt %, preferably 0.01 to 1.5 wt % on an as-received basis.

In addition to the ZDDP anti-wear additives which are essential components of the present disclosure, other anti-wear additives can be present, including zinc dithiocarbamates, molybdenum dialkyldithiophosphates, molybdenum dithiocarbamates, other organo molybdenum-nitrogen complexes, sulfurized olefins, etc.

The term "organo molybdenum-nitrogen complexes" embraces the organo molybdenum-nitrogen complexes described in U.S. Pat. No. 4,889,647. The complexes are reaction products of a fatty oil, diethanolamine and a molybdenum source. Specific chemical structures have not been assigned to the complexes. U.S. Pat. No. 4,889,647 reports an infrared spectrum for a typical reaction product of that disclosure; the spectrum identifies an ester carbonyl band at 1740 $cm^{-1}$ and an amide carbonyl band at 1620 $cm^{-1}$. The fatty oils are glyceryl esters of higher fatty acids containing at least 12 carbon atoms up to 22 carbon atoms or more. The molybdenum source is an oxygen-containing compound such as ammonium molybdates, molybdenum oxides and mixtures.

Other organo molybdenum complexes which can be used in the present disclosure are tri-nuclear molybdenum-sulfur compounds described in EP 1 040 115 and WO 99/31113 and the molybdenum complexes described in U.S. Pat. No. 4,978,464.

In the above detailed description, the specific embodiments of this disclosure have been described in connection with its preferred embodiments. However, to the extent that the above description is specific to a particular embodiment or a particular use of this disclosure, this is intended to be illustrative only and merely provides a concise description of the exemplary embodiments. Accordingly, the disclosure is not limited to the specific embodiments described above, but rather, the disclosure includes all alternatives, modifications, and equivalents falling within the true scope of the appended claims. Various modifications and variations of this disclosure will be obvious to a worker skilled in the art and it is to be understood that such modifications and variations are to be included within the purview of this application and the spirit and scope of the claims.

EXAMPLES

Examples Group 1: Base Stocks

A number of PAO base stock samples (S1-S5, and S7-S14, TABLE I below) and one non-PAO sample (S6) were tested for the EHL performances at 40° C., 80° C., and 120° C. Tests were conducted pursuant to standard processes developed by Powertrib, having an address at The Oxford Science Park, Magdalen Centre, Robert Robinson Avenue, Oxford, OX4 4GA, UK ("Powertrib") by Powertrib using its EHD Ultra Thin Film Thickness Measurement System (PCS Instruments), which measures the lubricant film thickness formed between a rolling steel ball on silica-coated disk, as a function of rolling speed. Film thicknesses at 40° C., 80° C., and 120° C., measured at a velocity of 0.2 m/s, corresponding to the elastohydrodynamic regime, were measured.

The samples tested and test results are provided in TABLE I, below. In this table, cPAO stands for conventional PAOs made by using a non-metallocene catalyst, mPAO for PAOs made by using a metallocene catalyst, chPAO for PAOs made by using a chromium oxide-based catalyst, PP/PE for a polypropylene/polyethylene copolymer, non-PAO for polymer that is not pure PAO, Lpg(x %) for average pendant group length of longest x mol % of the pendant groups, Lpg(M) for average pendant group length of all pendant groups excluding one methyl group on each molecule, if there is at least one methyl group among them; and EHL for electrohydrodynamic lubrication regime.

Among the samples, S1, S2, S3, S4, S5, S6, S7, S8, S10, S11, and S12 are commercially available products in the prior art. S9 and S13 are inventive, and S14 is comparative in that it has a KV100 of less than 200. S9, S13 and S14 and isotactic mPAOs having mole percentage of (mm)-triads of at least 95%.

From TABLE I and FIGS. 4-9, it can be seen that mPAOs which have high Lpg(x %) tend to have significantly higher EHL thicknesses than cPAOs with significantly lower Lpg(x %) values at temperatures from 40 to 120° C. Further, even at similar Lpg(x %), mPAOs tend to have higher EHL thicknesses than chPAOs. In addition, mPAOs with a KV100 of at least 200 demonstrated appreciably higher EHL thicknesses than those with lower KV100.

Figure 4:
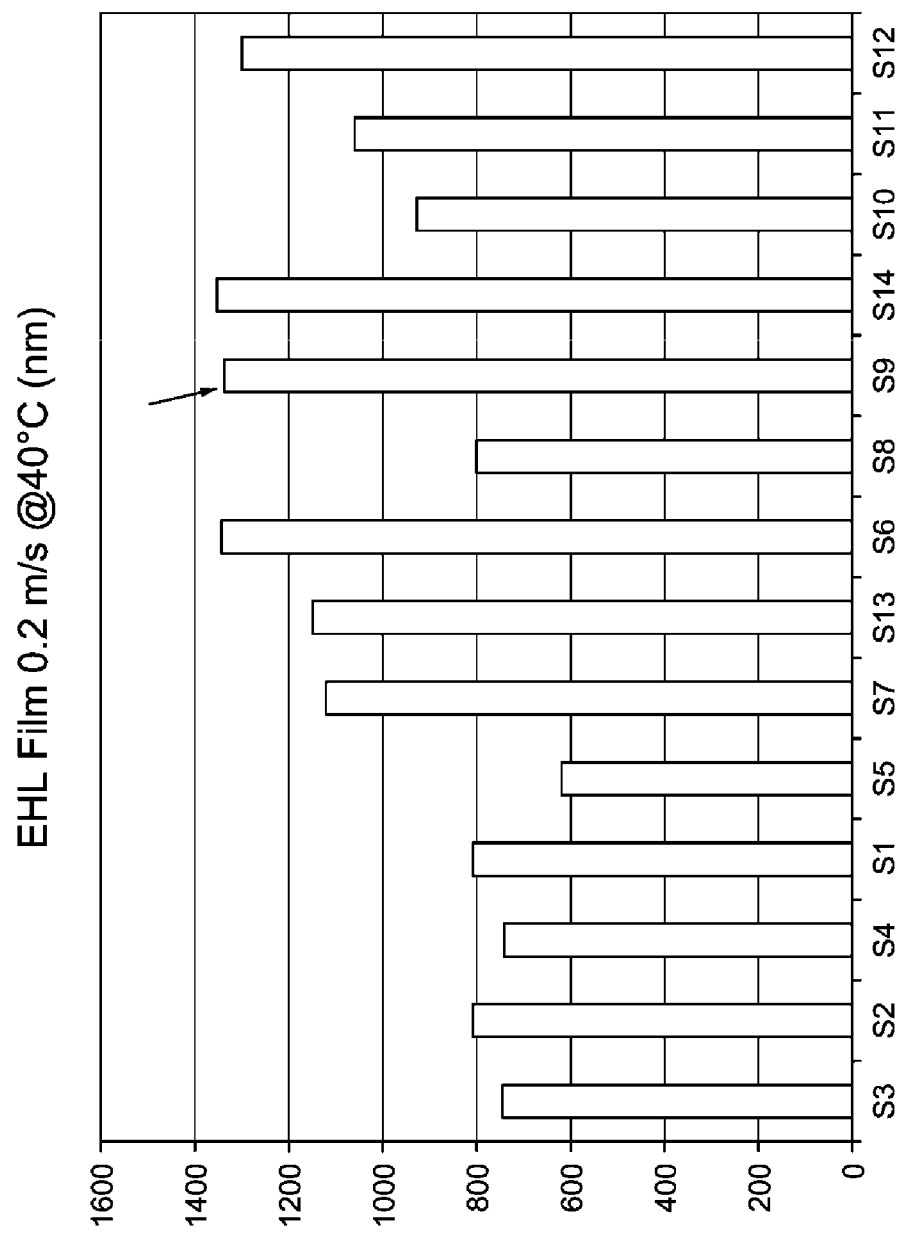
FIGS. 4 and 5 are diagrams showing EHL performance of a series of lubricant base stocks measured at 40° C. and 0.2 m/s.
Figure 5:
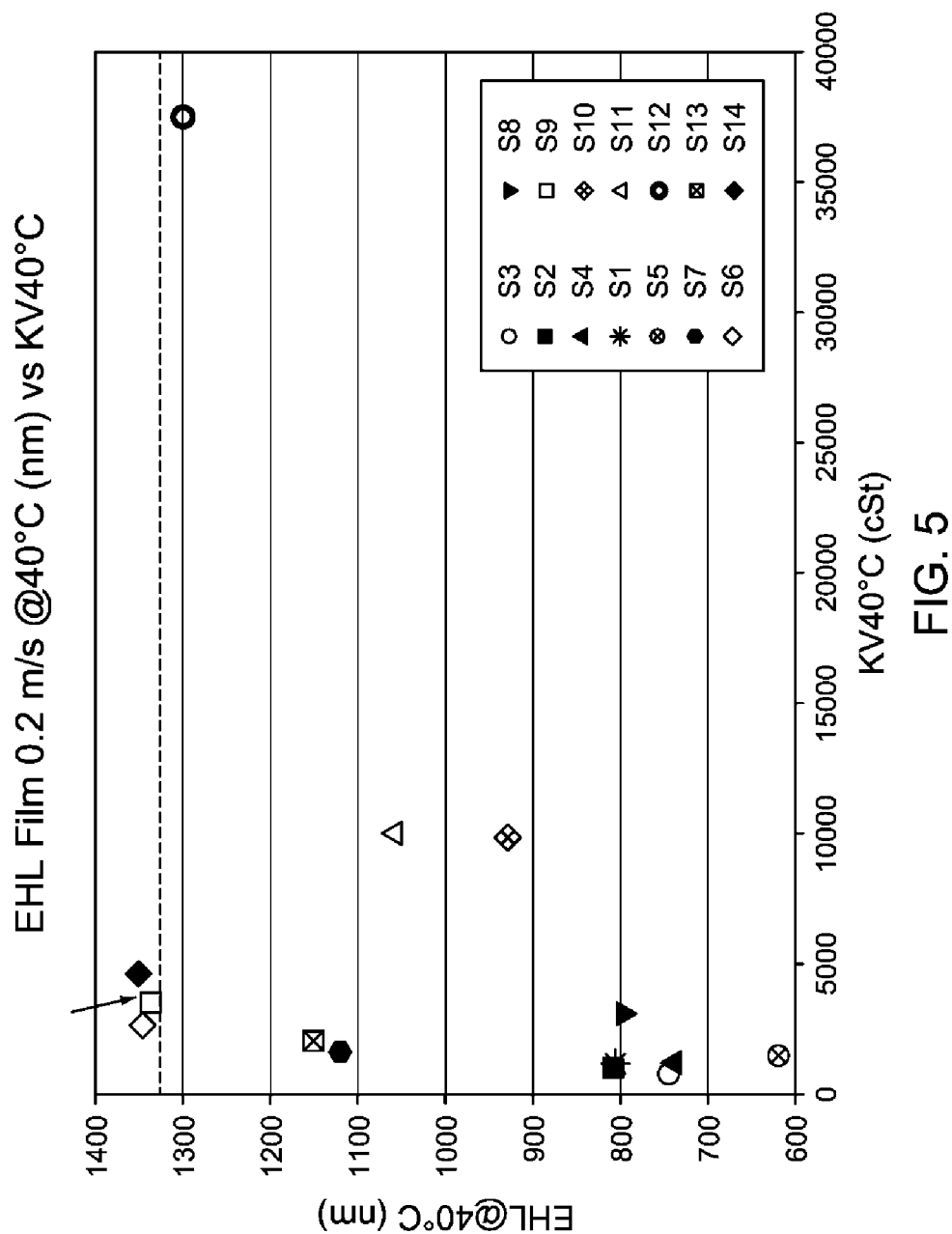

FIGS. 4 and 5 show the EHL thickness performance of the PAO samples at 40° C. when measured at 0.2 m/second. Clearly, S9, a mPAO with a KV100 of 314.3 and a Lpg(M) of about 7.3, and S14, a mPAO with a KV100 about 407 and a Lpg(M) of 6.9, have among the highest EHL thickness at this temperature. S6, a non-PAO with a Lpg(M) of about 3.0, also exhibits a high EHL thickness at this temperature. Other cPAOs have significantly lower EHL thickness at this temperature. S13, a mPAO with a KV100 of about 190 and a Lpg(M) of 6.9 as well, has appreciably lower EHL thickness at this temperature than S9 and S14. S9, S13, and S14 are all about 100 mol % isotactic in structure.

Figure 6:
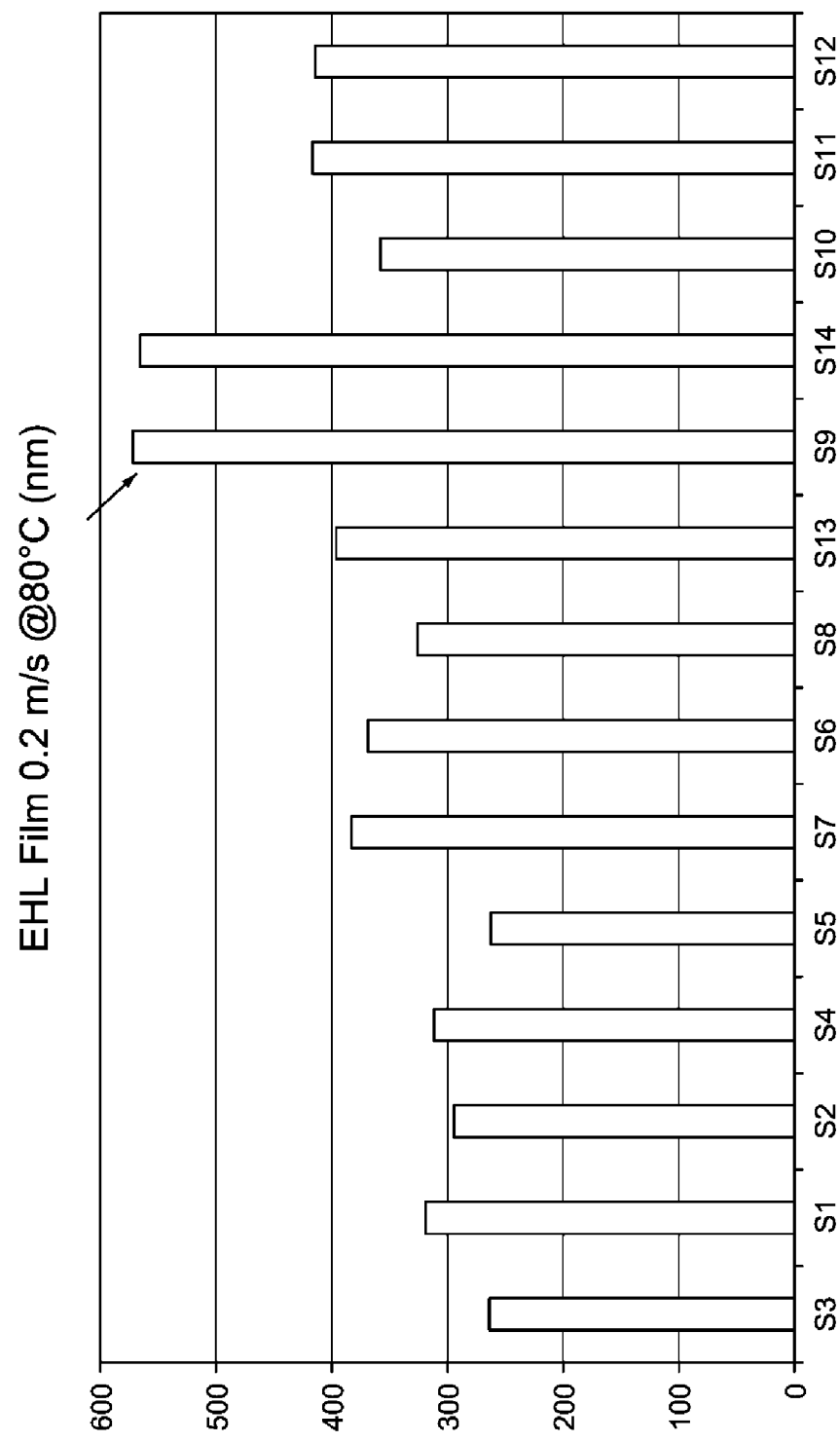
FIGS. 6 and 7 are diagrams showing EHL performance of a series of lubricant base stocks measured at 80° C. and 0.2 m/s.
Figure 7:
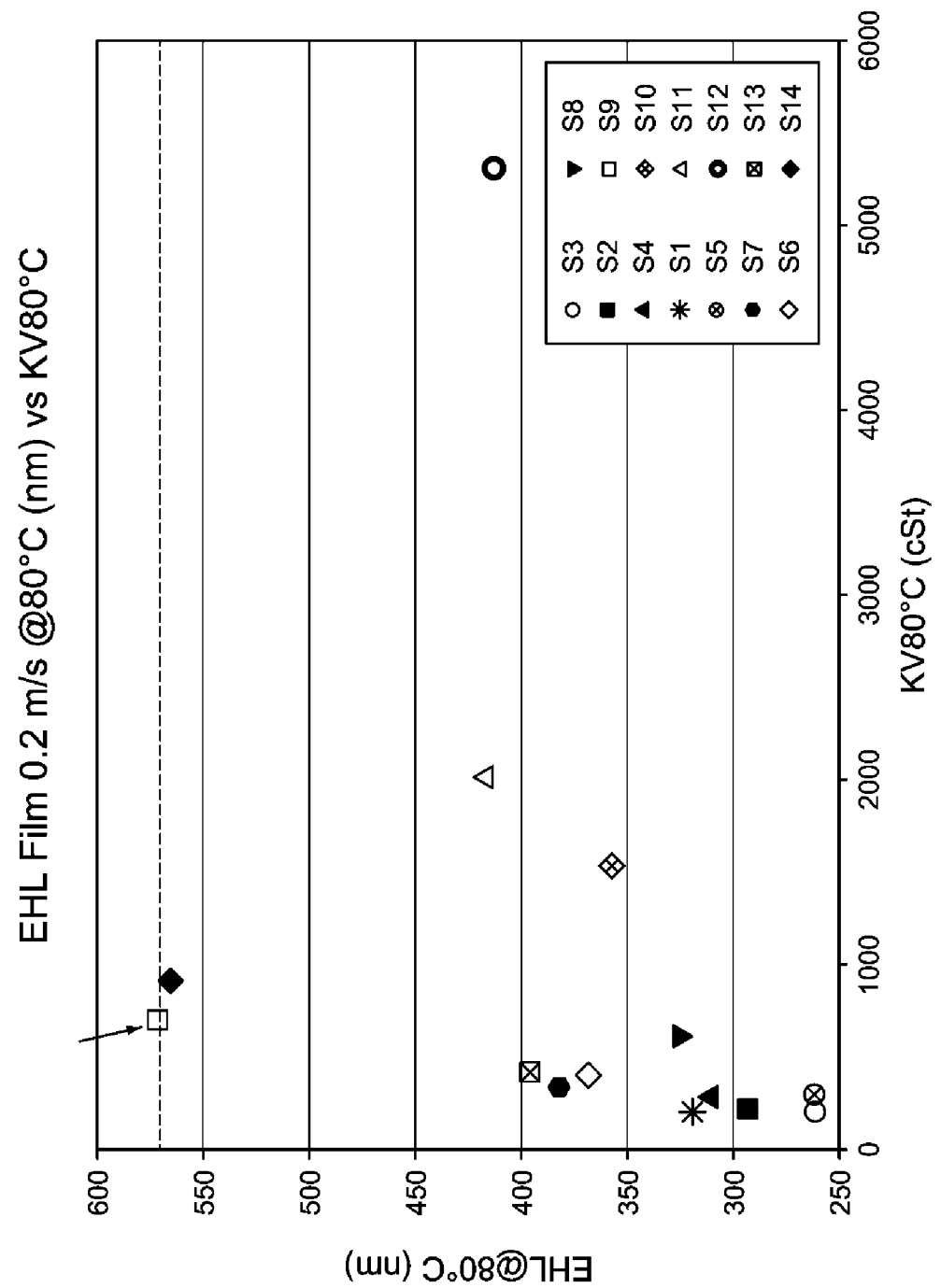

FIGS. 6 and 7 show the EHL thickness performance of the PAO samples at 80° C. when measured at 0.2 m/second. Clearly, again, S9 and S14, both mPAOs having a KV100 higher than 200 and Lpg(M) higher than 6.0, have among the highest EHL thickness at this temperature. S6, a cPAO with a Lpg(M) of about 3.0, also exhibits a high EHL thickness at this temperature. The performance of S6 reduced dramatically compared to at 40° C. Other cPAOs also have significantly lower EHL thicknesses at this temperature than S9 and 514. S13 also exhibited appreciably lower performance than S9 and S14 at this temperature.

Figure 8:
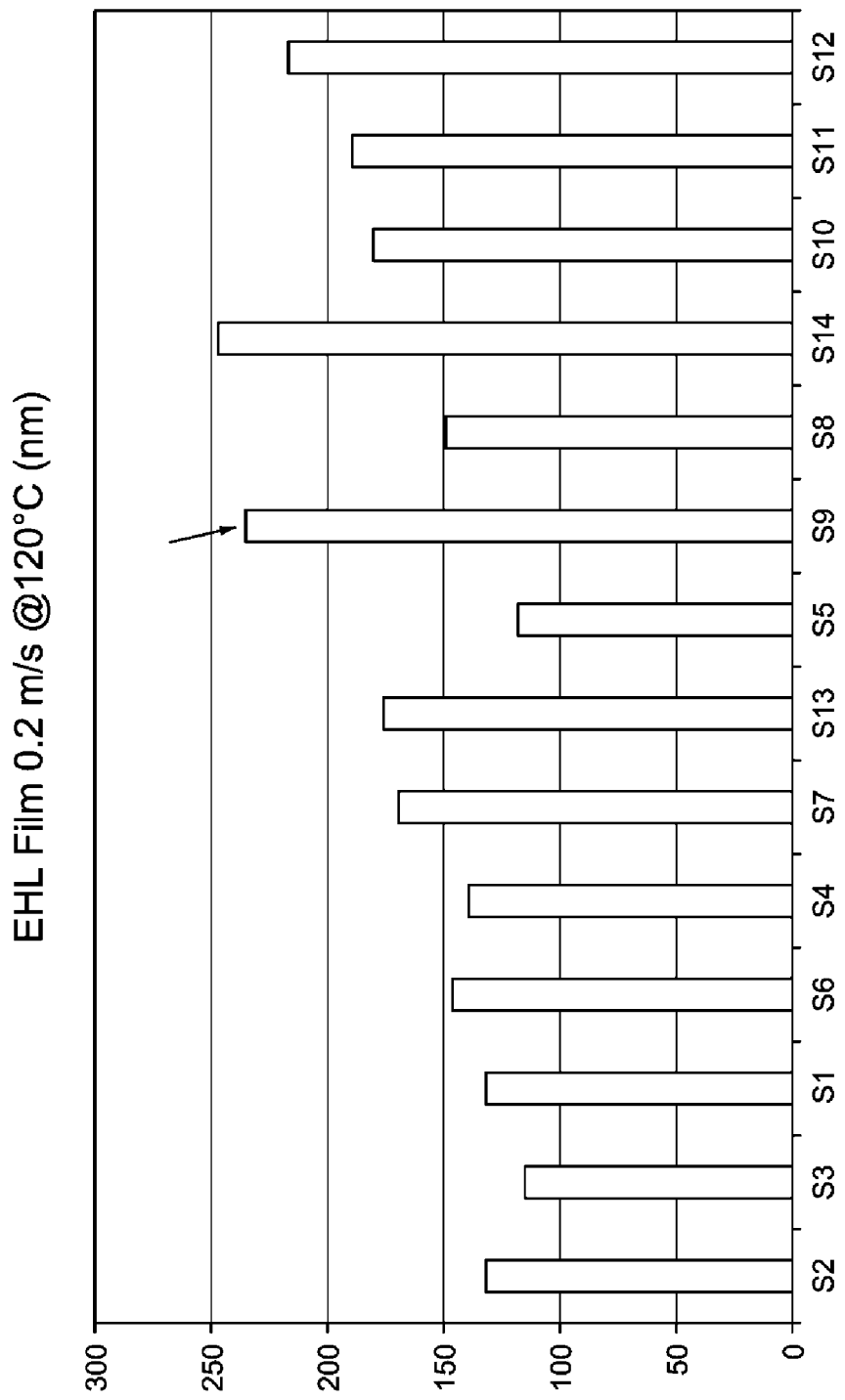
FIGS. 8 and 9 are diagrams showing EHL performance of a series of lubricant base stocks measured at 120° C. and 0.2 m/s.
Figure 9:
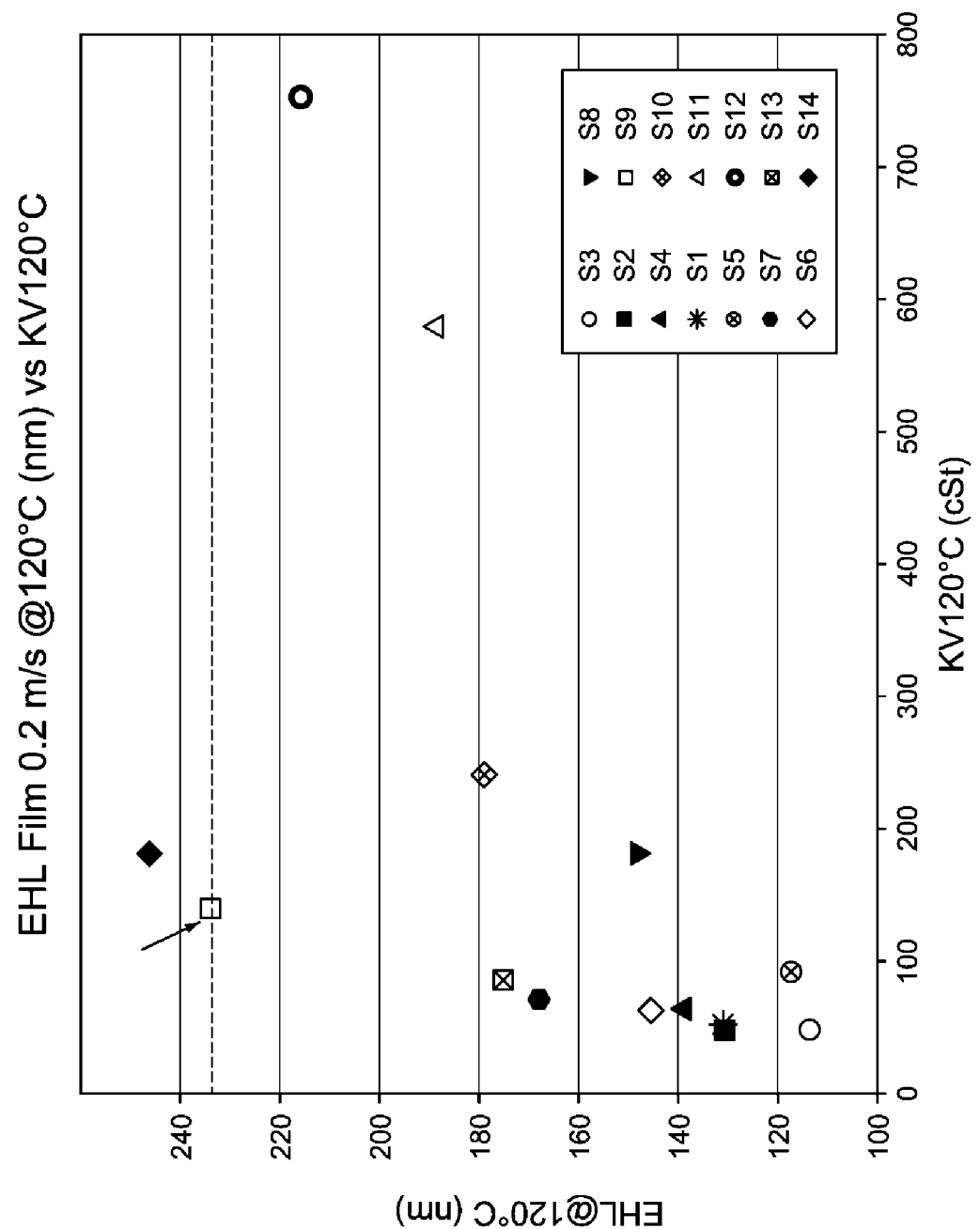

FIGS. 8 and 9 show the EHL thickness performance of the PAO samples at 120° C. when measured at 0.2 m/second. Clearly, again, S9 and S14 exhibit among the highest EHL thickness at this temperature. S6, a cPAO with a Lpg(M) of about 3.0, also exhibits a high EHL thickness at this temperature. The performance of S6 reduced dramatically compared to at 40° C. Other cPAOs also have significantly lower EHL thicknesses at this temperature than S9 and S14. S13 also exhibited appreciably lower performance than S9 and S14 at this temperature.

The high EHL performance of the PAOs according to the present invention lend them special advantages in lubricants which normally undergo high-stress events, such as: gear box oils; clutch oils; and automotive transmission oils; axle oils, drive shaft oils, traction oils, metal working fluids, hydraulic oils, and the like.

In making the lubricant formulations, the PAO base stock of the present invention may be combined with: (i) other Group I, Group II, Group III, Group IV, or Group V base stocks, especially those with relatively low KV100 in order to obtain a lower total KV100; (ii) additives such as anti-oxidants, detergents, dispersants, pour point depressants, corrosion inhibitors/metal deactivators; seal compatibility additives, anti-foam agents, inhibitors and antirust additives, viscosity modifiers, antiwear agents, and extreme pressure agents, and the like. WO 2014/046984 A1 discloses many of these additives in detail, the relevant portion thereof (pages 30-47, paragraphs [00116] to [00183], among others) are incorporated herein in their entirety.

Examples Group 2: Lubricant Formulations

In this example series, commercially available base stocks were used to make lubricant formulations. Among these, SpectraSyn™ 40 and 100 (which are conventional, non-metallocene-based PAOs) and SpectraSyn Elite™ 65, 150, and 300 (which are metallocene-based PAOs) are available from ExxonMobil Chemical Company, 22777 Springwoods Village Parkway, Spring, Tex. 77389, U.S.A., Yubase® 4 is available from SK Lubricants Co., Ltd. having an address at 26, Jongro, Jongro-Gu, Seoul 110-728, Korea, and Lucant® HC 40 is available from Mitsui Chemicals America, Inc., having address at 800 Westchester Avenue, Suite 5306, Rye Brook, N.Y., U.S.A. Yubase® 4 is a conventional PAO base stock, while Lucant® HC 40 is a ethylene-propylene copolymer. Properties of these base stocks are given below in TABLE II below. Among all these, SpectraSyn Elite™ 300 demonstrated the highest EHL film thickness as neat base stock at 40° C., 80° C., and 120° C. Esterex™ A32 is Group V base stock commercially available from ExxonMobil Chemical Company. HITEC® 385 is an lubricant additive obtained from Afton Chemical Corporation having an address at 500 Spring Street, Richmond, Va. 23219, U.S.A.

Examples Group 2a: AGO Formulations

Figure 10A:
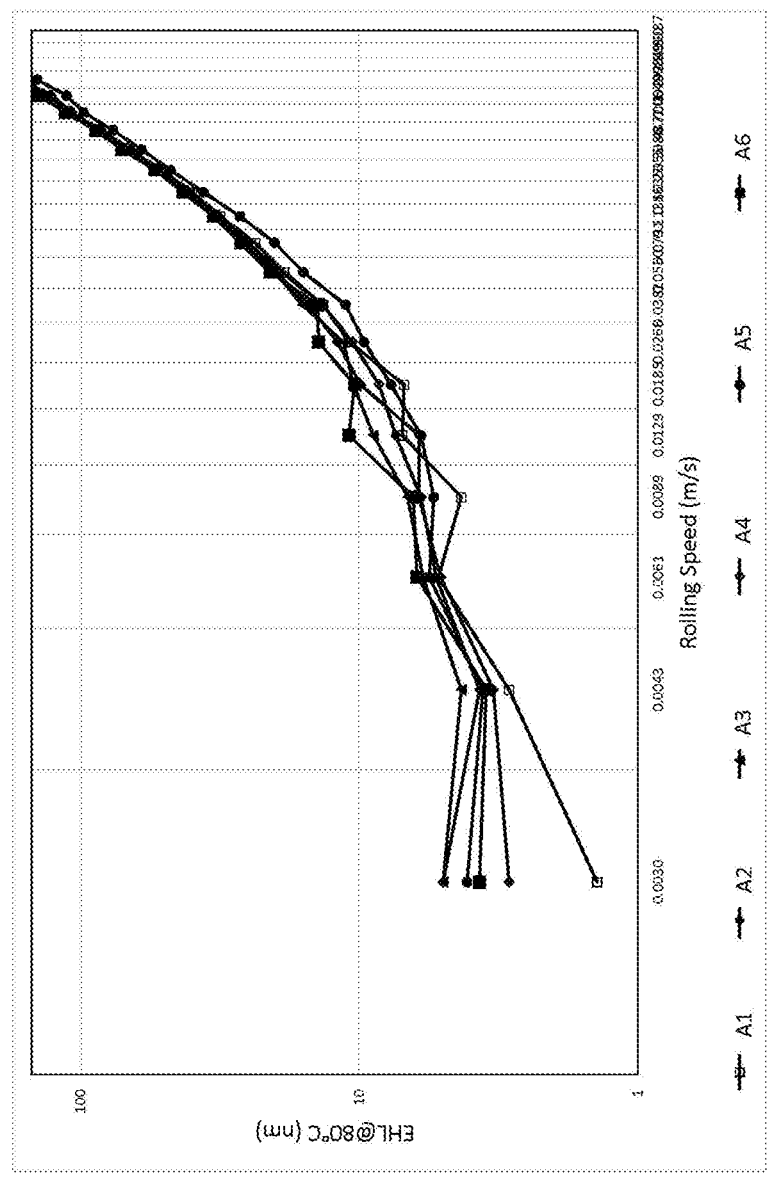
FIGS. 10A and 10B are diagrams showing EHL performance of a series of AGO lubricant formulations measured at 80° C. and 120° C., respectively.
Figure 10B:
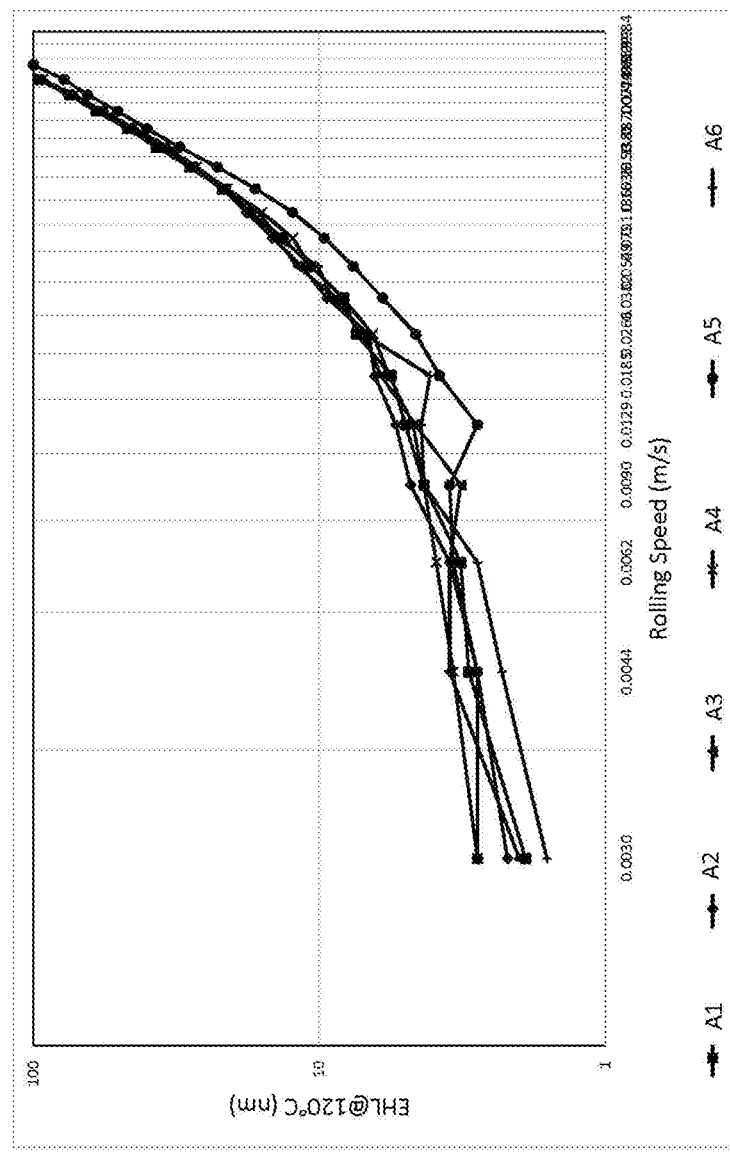
Figure 11A:
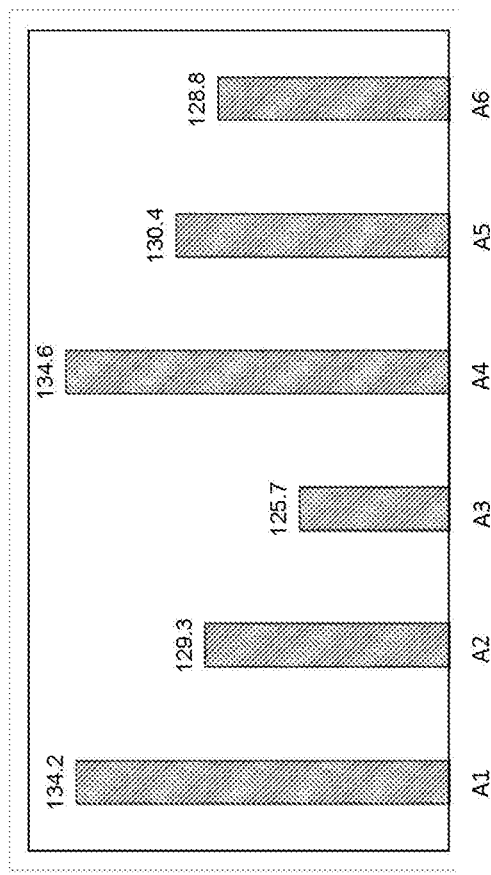

A series of AGO 80W-85 lubricant compositions were formulated and tested. Data are reported in TABLE III below. EHL film thickness data at 80° C. and 120° C. of these formulations are shown in FIGS. 10A and 10B, respectively. FZG test results are shown in FIGS. 11A and 10B, respectively. The FZG results shown herein are total cumulative gear weight loss in grams.

EHL film thickness of the AGO formulations may not reflect the same order of EHL film thickness of the neat high viscosity base stocks.

FZG results of the formulation clearly shows that Formulation No. A5, which contains SpectraSyn Elite™ 300, demonstrated the lowest gear weight loss at end of stage even with the lowest treat rate, which indicates superior wear protection.

Examples Group 2b: ATF Formulations

Figure 12A:
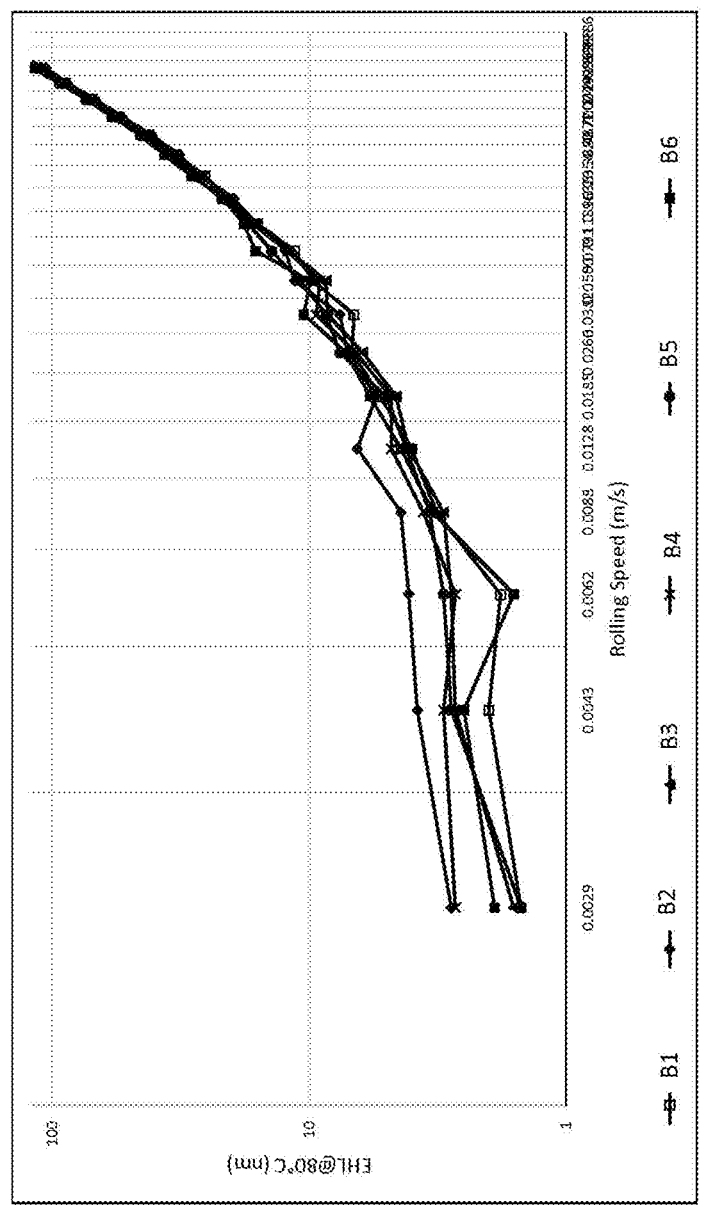
FIGS. 12A and 12B are diagrams showing EHL performance of a series of ATF lubricant formulations measured at 80° C. and 120° C., respectively.
Figure 12B:
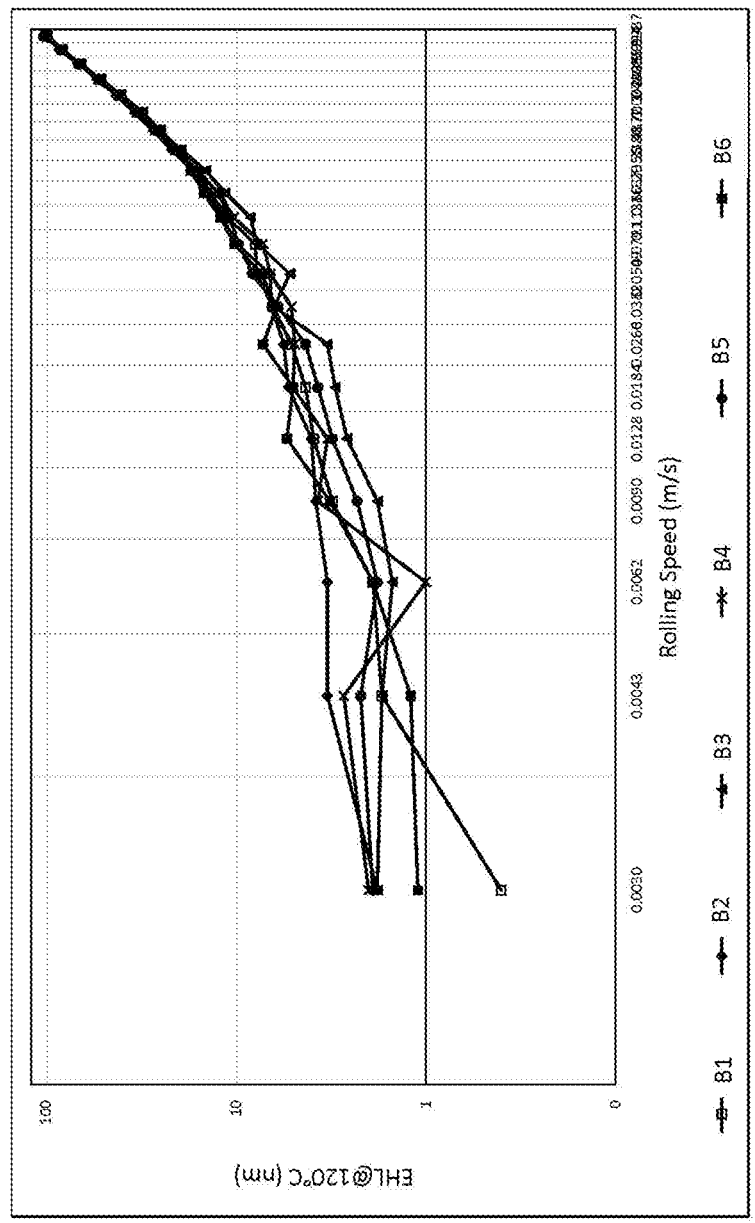
Figure 13A:
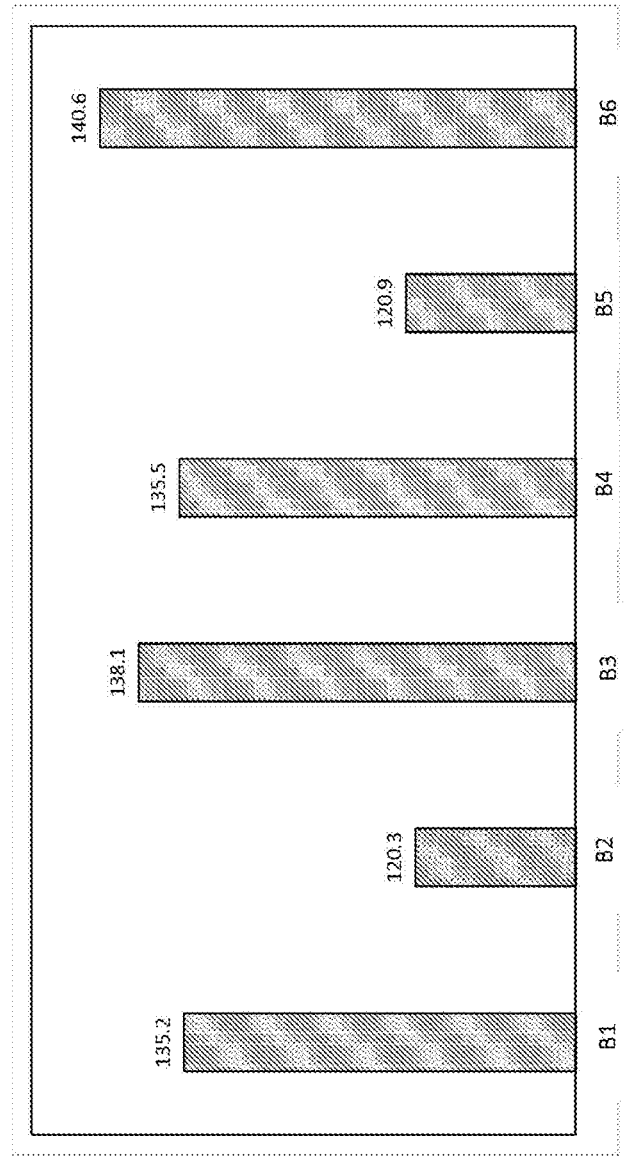
FIGS. 13A and 13B are diagrams showing FZG test performance of a series of ATF lubricant formulations in terms of oil temperature at end of stage and gear weight loss at the end of stage, respectively.
Figure 13B:
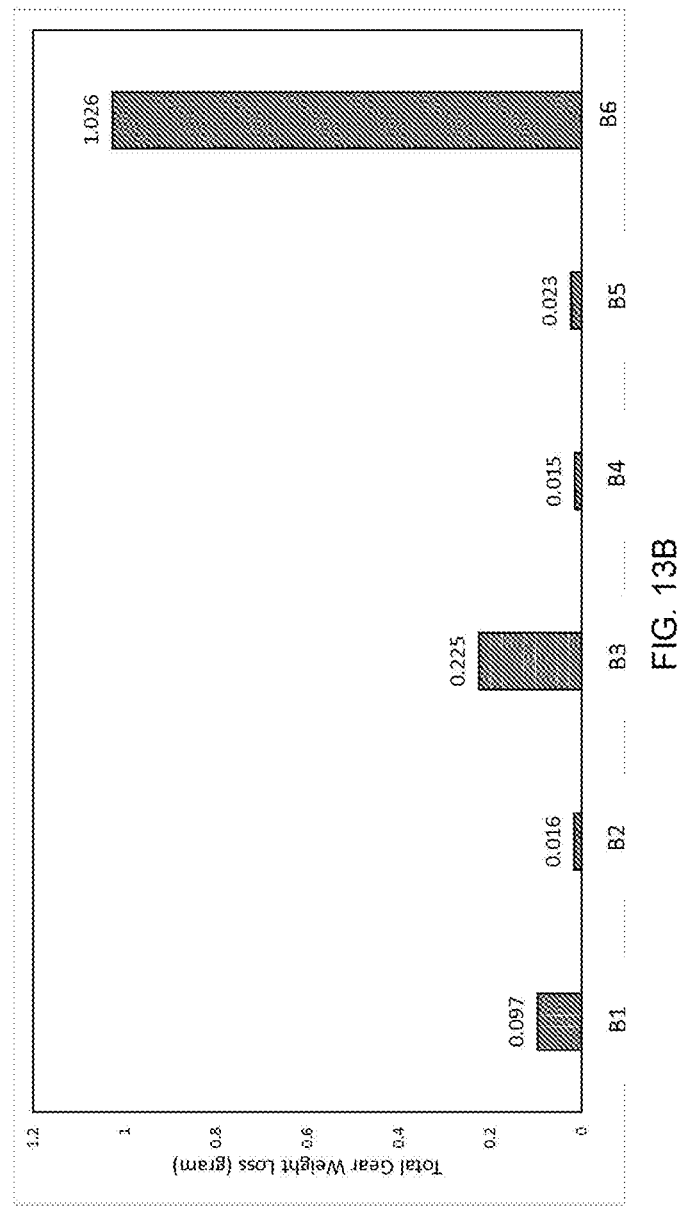

A series of automatic transmission fluids having a KV100 of about 5 cSt were formulated and tested. Treat rates of high-viscosity base stocks were maintained at 1 wt % among all formulations. Data are reported in TABLE IV below. EHL film thickness data at 80° C. and 120° C. of these formulations are shown in FIGS. 12A and 12B, respectively. FZG test results are shown in FIGS. 13A and 13B, respectively.

EHL film thickness of the ATF formulations may not reflect the same order of EHL film thickness of the neat high viscosity base stocks.

FZG results of the formulations clearly show that Formulation No. B5 (which contains SpectraSyn Elite™ 300) demonstrated very low gear weight loss at end of stage (plot on the right) with equivalent treat rate, which indicates good wear protection of SSE300 relating to the provided base stock EHL film thickness.

TABLE I

| Sample | | KV40 (cSt) | KV80 (cSt) | KV100 (cSt) | KV120 (cSt) | Lpg | | | | | | Lpg (M) | EHL Thickness (nm, @ 0.2 m/s) @ | | |
|---|---|---|---|---|---|---|---|---|---|---|---|---|---|---|---|
| No. | Type | | | | | (5%) | (10%) | (20%) | (50%) | (60%) | (100%) | | 40° C. | 80° C. | 120° C. |
| S1 | cPAO | 1272 | 211 | 100.7 | 51.25 | 5 | 5 | 5 | 4.5 | 4.5 | 4 | 4.1 | 806.6 | 319 | 131.2 |
| S2 | mPAO | 1034 | 219 | 100.6 | 46.27 | 6 | 6 | 6 | 6 | 6 | 5.8 | 6 | 807.3 | 293 | 130.4 |
| S3 | mPAO | 907.9 | 209 | 100.4 | 48.2 | 8 | 8 | 8 | 8 | 8 | 7.66 | 8 | 743.9 | 262 | 113.8 |
| S4 | mPAO | 1270 | 286.5 | 136.1 | 64.65 | 8 | 8 | 8 | 8 | 8 | 7.74 | 8 | 741 | 311 | 138.9 |
| S5 | chPAO | 1500 | 304 | 150 | 91.4 | 8 | 8 | 8 | 8 | 8 | 7.75 | 8 | 618.1 | 262 | 117.7 |
| S6 | Non-PAO | 2646 | 409 | 160.7 | 63.17 | 5 | 5 | 4.5 | 4 | 3 | 3 | 3 | 1344.8 | 368.1 | 145.6 |
| S7 | mPAO | 1645 | 344 | 157.1 | 71.8 | 10 | 10 | 10 | 7.71 | 7.42 | 6.66 | 6.9 | 1119.4 | 382 | 168.2 |
| S8 | chPAO | 3100 | 615 | 300 | 181.3 | 8 | 8 | 8 | 8 | 8 | 7.79 | 8 | 796.4 | 325 | 148.2 |
| S9 | mPAO | 3547 | 705 | 314.3 | 140.1 | 10 | 10 | 10 | 8.5 | 8.08 | 7.13 | 7.3 | 1336.2 | 571 | 234.2 |
| S10 | PE/PP | 9850 | 1542 | 610.1 | 241.4 | 1 | 1 | 1 | 1 | 1 | 1 | 1 | 928.4 | 357 | 179 |
| S11 | chPAO | 10000 | 2015 | 1000 | 578 | 8 | 8 | 8 | 8 | 8 | 7.87 | 8 | 1059.8 | 416 | 188.5 |
| S12 | PE/PP | 37500 | 5312 | 2000 | 752.9 | 1 | 1 | 1 | 1 | 1 | 1 | 1 | 1300.6 | 413 | 215.7 |
| S13 | mPAO | 2084 | 422.9 | 190.5 | 85.82 | 10 | 10 | 10 | 7.71 | 7.42 | 6.66 | 6.9 | 1149.9 | 395.2 | 175.3 |
| S14 | mPAO | 4601 | 913.5 | 407 | 181.36 | 10 | 10 | 10 | 8.5 | 8.08 | 7.13 | 7.3 | 1350.1 | 564.9 | 246.1 |

TABLE II

| Property | ASTM Test Method | Unit | Yubase® 4 | SpectraSyn™ 40 | SpectraSyn™ 100 | SpectraSyn Elite™ 65 | SpectraSyn Elite™ 150 | SpectraSyn Elite™ 300 | Lucant® HC 40 |
|---|---|---|---|---|---|---|---|---|---|
| KV100 | D445 | cSt | 4.2 | 39.83 | 104.1 | 63.9 | 161.7 | 295.1 | 41 |
| KV40 | D445 | cSt | 19.24 | 405.9 | 1300 | 583.4 | 1697 | 3256 | 416.6 |
| Viscosity Index | D2270 | None | 125 | 147 | 170 | 183 | 212 | 240 | 149 |
| Pour Point | D5950 | °C. | −15 | −45 | −36 | −48 | −39 | −36 | −45 |
| Brookfield Viscosity @ −40° C. | D2983 | cP | Frozen | 934,000 | Frozen | 573,000 | Frozen | Frozen | 1,320,000 |
| Brookfield Viscosity @ −26° C. | D2983 | cP | 5,650 | 102,200 | 522,600 | 87,900 | 353,600 | 817,000 | 129,600 |
| Brookfield Viscosity @ −15° C. | D2983 | cP | 972 | 27,810 | 128,000 | 27,090 | 109,800 | 230,100 | 34,700 |

TABLE III

| Formulation No. | | | A1 | A2 | A3 | A4 | A5 | A6 |
|---|---|---|---|---|---|---|---|---|
| Composition | | Unit | A1 | A2 | A3 | A4 | A5 | A6 |
| Components | Yubase® 4 | wt % | 30.10 | 48.20 | 35.40 | 47.50 | 54.50 | 36.60 |
| | SpectraSyn™ 40 | wt % | 50.40 | — | — | — | — | — |
| | SpectraSyn™ 100 | wt % | — | 32.30 | — | — | — | — |
| | SpectraSyn Elite™ 65 | wt % | — | — | 45.10 | — | — | — |
| | SpectraSyn Elite™ 150 | wt % | — | — | — | 33.00 | — | — |
| | SpectraSyn Elite™ 300 | wt % | — | — | — | — | 26.00 | — |
| | Lucant® HC 40 | wt % | — | — | — | — | — | 43.90 |
| | Exterex™ A32 | wt % | 12.00 | 12.00 | 12.00 | 12.00 | 12.00 | 12.00 |
| | HITEC® 385 | wt % | 7.50 | 7.50 | 7.50 | 7.50 | 7.50 | 7.50 |
| | Total | wt % | 100.00 | 100.00 | 100.00 | 100.00 | 100.00 | 100.00 |
| Property | ASTM Test Method | Unit | A1 | A2 | A3 | A4 | A5 | A6 |
| KV100 | D445 | cSt | 12.15 | 12.26 | 12.28 | 12.35 | 12.33 | 12.28 |
| KV40 | D445 | cSt | 76.58 | 72.34 | 71.19 | 68.82 | 66.52 | 76.81 |
| Viscosity Index | D2270 | None | 155 | 168 | 172 | 180 | 186 | 156 |
| Pour Point | D5950 | °C. | −30 | −21 | −27 | −24 | −21 | −33 |
| Brookfield Viscosity @ −40° C. | D2983 | cP | Frozen | Frozen | Frozen | Frozen | Frozen | Frozen |
| Brookfield Viscosity @ −26° C. | D2983 | cP | 10,480 | 15,240 | 10,120 | 13,840 | 17,370 | 14,540 |
| Four-ball wear test | D4172 | mm | 0.42 | 0.42 | 0.41 | 0.45 | 0.40 | 0.41 |
| Four-ball EP, Load Wear | D2783 | Kgf | 61.0 | 55.0 | 55.0 | 55.0 | 56.0 | 60.7 |
| Four-ball EP Test | D2783 | Kgf | 315 | 315 | 315 | 315 | 315 | 315 |

TABLE IV

| Formulation No. | | | B1 | B2 | B3 | B4 | B5 | B6 |
|---|---|---|---|---|---|---|---|---|
| Composition | | Unit | B1 | B2 | B3 | B4 | B5 | B6 |
| Components | Yubase® 4 | wt % | 87.00 | 87.00 | 87.00 | 87.00 | 87.00 | 87.00 |
| | SpectraSyn™ 40 | wt % | 1.00 | — | — | — | — | — |
| | SpectraSyn™ 100 | wt % | — | 1.00 | — | — | — | — |
| | SpectraSyn Elite™ 65 | wt % | — | — | 1.00 | — | — | — |
| | SpectraSyn Elite™ 150 | wt % | — | — | — | 1.00 | — | — |
| | SpectraSyn Elite™ 300 | wt % | — | — | — | — | 1.00 | — |
| | Lucant® HC 40 | wt % | — | — | — | — | — | 1.00 |
| | HITEC® 3419 | wt % | 12.00 | 12.00 | 12.00 | 12.00 | 12.00 | 12.00 |
| | Total | wt % | 100.00 | 100.00 | 100.00 | 100.00 | 100.00 | 100.00 |
| Property | ASTM Test Method | Unit | B1 | B2 | B3 | B4 | B5 | B6 |
| KV100 | D445 | cSt | 5.076 | 5.147 | 5.081 | 5.133 | 5.196 | 5.101 |
| KV40 | D445 | cSt | 24.89 | 25.35 | 24.95 | 25.23 | 25.61 | 25.12 |
| Viscosity Index | D2270 | None | 136 | 137 | 136 | 137 | 138 | 136 |
| Pour Point | D5950 | °C. | −30 | −27 | −30 | −27 | −30 | −24 |
| Brookfield Viscosity @ −40° C. | D2983 | cP | Frozen | Frozen | Frozen | Frozen | Frozen | Frozen |
| Brookfield Viscosity @ −26° C. | D2983 | cP | 3,798 | 3,732 | 3,546 | 3,612 | 3,954 | 56,600 |

The invention claimed is:

1. A lubricant composition comprising a high-viscosity PAO base stock having a KV100 of at least 190 cSt and comprising multiple PAO molecules comprising at least 200 carbon atoms per molecule, wherein:
   each of substantially all of the PAO molecules comprises multiple pendant groups;
   the average pendant group length of all the pendant groups on each PAO molecule among at least 90 mol % of all of the PAO molecules is at least 6.0;
   the concentration of the high-viscosity PAO base stock is no higher than 75 wt % of the total weight of the lubricant composition; and
   the high-viscosity PAO base stock is produced by using a metallocene catalyst from a feed comprising one or more C6-C20 alpha olefins.

2. The lubricant composition of claim 1, wherein the high-viscosity PAO base stock has a KV100 of at most 600 cSt.

3. The lubricant composition of claim 1, wherein at least 90 mol % of all of the PAO molecules contained in the high-viscosity base stock comprise at least 300 carbon atoms per molecule.

4. The lubricant composition of claim 1, wherein at least 90 mol % of all of the PAO molecules in the high-viscosity base stock comprise at most 1000 carbon atoms per molecule.

5. The lubricant composition of claim 1, wherein:
   in at least 90 mol % of all of the PAO molecules in the high-viscosity base stock, at most 5 mol % of the pendant groups are bonded to adjacent carbon atoms on the main carbon chain of the respective PAO molecule.

6. The lubricant composition of claim 1, wherein:
   in at least 90 mol % of all of the PAO molecules in the high-viscosity base stock, at least 90 mol % of the pendant groups are bonded to carbon atoms on the main carbon chain of the PAO molecule that is separated by only one intermediate carbon atom from the next carbon atom to which a pendant group is attached.

7. The lubricant composition of claim 1, wherein:
   in at least 90 mol % of all of the PAO molecules in the high-viscosity base stock, there is only one methyl group among all pendant groups in each molecule.

8. The lubricant composition of claim 1, wherein:
   the average pendant group length of all the pendant groups on each of the PAO molecule among at least 90 mol % of all of the PAO molecules is at least 7.0.

9. The lubricant composition of claim 1, wherein:
   in at least 90 mol % of all of the PAO molecules, the mole percentage of mesotriads is at least 90%.

10. The lubricant composition of claim 1, wherein:
    in at least 90 mol % of all of the PAO molecules, at least 50 mol % of the pendant groups attached to an individual PAO molecule have the same length.

11. The lubricant composition of claim 1, wherein:
    in at least 90 mol % of all of the PAO molecules, at least 90 mol % of the pending groups have the same length.

12. The lubricant composition of claim 1, wherein the high-viscosity base stock has a polydispersity of from 1.20 to 2.00.

13. The lubricant composition of claim 1, wherein the high-viscosity base stock has a KV100 in the range from 190 to 400.

14. The lubricant composition of claim 1, wherein:
    the longest 5%, 10%, 20%, 40%, 50%, and 100%, by mole, of the pendant groups of all of the molecules of the high-viscosity base stock have an average pendant group length of Lpg(5%), Lpg(10%), Lpg(20%), Lpg(40%), Lpg(50%), and Lpg(100%), respectively; and at least one of the following conditions is met:
    (i) $7.0 \leq Lpg(5\%) \leq 14.0$;
    (ii) $7.0 \leq Lpg(10\%) \leq 14.0$;
    (iii) $6.5 \leq Lpg(20\%) \leq 12.0$;
    (iv) $6.0 \leq Lpg(40\%) \leq 12.0$;
    (v) $5.5 \leq Lpg(50\%) \leq 10.0$; and
    (vi) $5.0 \leq Lpg(100\%) \leq 10.0$.

15. The lubricant composition of claim 1, wherein:
    at least 90 mol % of all of the PAO molecules in the high-viscosity base stock comprises from 30 to 70 pendant groups.

16. The lubricant composition of claim 1, wherein the high-viscosity base stock has an EHL film thickness of at least 900 nm at 40° C. at 0.2 m/s.

17. The lubricant composition of claim 1, wherein the high-viscosity base stock has an EHL film thickness of at least 360 nm at 80° C. at 0.2 m/s.

18. The lubricant composition of claim 1, wherein the the high-viscosity base stock has an EHL film thickness of at 160 nm at 120° C. at 0.2 m/s.

19. The lubricant composition of claim 1, wherein the high-viscosity base stock has a Lpg(M) of at least 6.0, wherein Lpg(M) is the average length of the pendant groups excluding one methyl in at least 90 mol % of the PAO molecules, if one of more methyl is present on the PAO molecule.

20. The lubricant composition of claim 1, wherein in the high-viscosity base stock, each of the multiple PAO molecules has a percentage of (mm)-triads of at least 80 mol % as determined by $^{13}$C-NMR.

21. The lubricant composition of claim 1, which is a gear box lubricant.

22. The lubricant composition of claim 21, which exhibits a gear weight loss of at most 0.030 gram at the end of stage when measured by ASTM D5182.

23. The lubricant composition of claim 1, which is an automobile transmission lubricant.

24. The lubricant composition of claim 23, further comprising a low-viscosity base stock having a KV100 of no higher than 8 cSt, wherein:
    (i) the concentration of the high-viscosity PAO base stock is at most 5 wt % of the total weight of the lubricant composition;
    (ii) the concentration of the low-viscosity base stock is at least 70 wt % of the total weight of the lubricant composition; and
    (iii) the lubricant composition exhibits a weight loss of at most 0.100 gram at the end of stage when measured by ASTM D5182.

* * * * *